(12) United States Patent
Liu et al.

(10) Patent No.: US 11,968,832 B2
(45) Date of Patent: Apr. 23, 2024

(54) MULTIPLE-STACK THREE-DIMENSIONAL MEMORY DEVICE AND FABRICATION METHOD THEREOF

(71) Applicant: Yangtze Memory Technologies Co., Ltd., Hubei (CN)

(72) Inventors: Jun Liu, Hubei (CN); Zongliang Huo, Hubei (CN); Li Hong Xiao, Hubei (CN); Zhenyu Lu, Hubei (CN); Qian Tao, Hubei (CN); Yushi Hu, Hubei (CN); Sizhe Li, Hubei (CN); Zhao Hui Tang, Hubei (CN); Yu Ting Zhou, Hubei (CN); Zhaosong Li, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 671 days.

(21) Appl. No.: 17/072,958

(22) Filed: Oct. 16, 2020

(65) Prior Publication Data

US 2021/0043651 A1 Feb. 11, 2021

Related U.S. Application Data

(60) Division of application No. 16/126,919, filed on Sep. 10, 2018, now Pat. No. 10,868,031, which is a
(Continued)

(51) Int. Cl.
*H10B 43/27* (2023.01)
*H01L 21/033* (2006.01)
(Continued)

(52) U.S. Cl.
CPC ......... *H10B 43/27* (2023.02); *H01L 21/0337* (2013.01); *H01L 21/3086* (2013.01);
(Continued)

(58) Field of Classification Search
CPC ........ H10B 43/27; H10B 43/35; H10B 43/40; H10B 41/27; H10B 41/50; H10B 43/50;
(Continued)

(56) References Cited

U.S. PATENT DOCUMENTS 9,419,135 B2 8/2016 Baenninger et al.
9,449,987 B1 * 9/2016 Miyata ................... H10B 43/10
(Continued)

FOREIGN PATENT DOCUMENTS

CN 105977257 A 9/2016
CN 107431063 A 12/2017
(Continued)

OTHER PUBLICATIONS

International Search Report and Written Opinion of the International Searching Authority directed to related International Patent Application No. PCT/CN2018/097432, dated Apr. 16, 2019; 8 pages.
(Continued)

*Primary Examiner* — Victor A Mandala
(74) *Attorney, Agent, or Firm* — Sterne, Kessler, Goldstein & Fox P.L.L.C.

(57) ABSTRACT

Methods and structures of a three-dimensional memory device are disclosed. In an example, the disclosed method comprises forming a plurality of dielectric stacks stacked on one another over a substrate to create a multiple-stack staircase structure. Each one of the plurality of dielectric stacks comprises a plurality of dielectric pairs arranged along a direction perpendicular to a top surface of the substrate. The method further comprises forming a filling structure that surrounds the multiple-stack staircase structure, forming a semiconductor channel extending through the multiple-staircase structure, wherein the semiconductor channel comprises unaligned sidewall surfaces, and forming
(Continued)

a supporting pillar extending through at least one of the multiple-staircase structure and the filling structure, wherein the supporting pillar comprises aligned sidewall surfaces.

20 Claims, 13 Drawing Sheets

Related U.S. Application Data continuation of application No. PCT/CN2018/097432, filed on Jul. 27, 2018.

(51) Int. Cl.
| | | |
|---|---|---|
| *H01L 21/308* | (2006.01) | |
| *H01L 23/532* | (2006.01) | |
| *H10B 43/35* | (2023.01) | |
| *H10B 43/40* | (2023.01) | |

(52) U.S. Cl.
CPC ....... *H01L 23/53295* (2013.01); *H10B 43/35* (2023.02); *H10B 43/40* (2023.02)

(58) Field of Classification Search
CPC ..... H10B 43/20; H10B 41/35; H01L 21/0337; H01L 21/3086; H01L 23/53295; H01L 21/0335; H01L 21/31144
See application file for complete search history.

(56) References Cited

U.S. PATENT DOCUMENTS

| | | | | |
|---|---|---|---|---|
| 9,570,463 | B1* | 2/2017 | Zhang | H01L 29/66666 |
| 9,576,967 | B1* | 2/2017 | Kimura | H10B 43/10 |
| 9,754,963 | B1 | 9/2017 | Kawamura et al. | |
| 9,853,043 | B2* | 12/2017 | Lu | H01L 21/32055 |
| 10,854,627 | B1* | 12/2020 | Moriyama | H01L 29/66666 |
| 10,868,031 | B2 | 12/2020 | Liu et al. | |
| 2010/0133599 | A1 | 6/2010 | Chae et al. | |
| 2012/0061744 | A1* | 3/2012 | Hwang | H10B 43/30 |
| | | | | 257/E27.081 |
| 2015/0236038 | A1 | 8/2015 | Pachamuthu et al. | |
| 2016/0111440 | A1 | 4/2016 | Chae et al. | |
| 2016/0268263 | A1 | 9/2016 | Lee et al. | |
| 2017/0103996 | A1 | 4/2017 | Lee et al. | |
| 2017/0207221 | A1 | 7/2017 | Kim et al. | |
| 2017/0278859 | A1 | 9/2017 | Sharangpani et al. | |
| 2017/0352678 | A1* | 12/2017 | Lu | H10B 43/10 |
| 2018/0166329 | A1 | 6/2018 | Huang et al. | |
| 2018/0174044 | A1 | 6/2018 | Na | |
| 2018/0175044 | A1 | 6/2018 | Rhie | |
| 2018/0233512 | A1 | 8/2018 | Van Houdt et al. | |
| 2018/0331117 | A1* | 11/2018 | Titus | H10B 43/27 |
| 2018/0366487 | A1* | 12/2018 | Okizumi | H10B 43/50 |
| 2019/0006381 | A1* | 1/2019 | Nakatsuji | H10B 43/10 |
| 2019/0102104 | A1* | 4/2019 | Righetti | G06F 3/0688 |
| 2020/0035694 | A1* | 1/2020 | Kaminaga | H10B 43/20 |
| 2020/0035699 | A1 | 1/2020 | Liu et al. | |

FOREIGN PATENT DOCUMENTS

| | | |
|---|---|---|
| CN | 107579069 A | 1/2018 |
| CN | 107680972 A | 2/2018 |
| CN | 107771356 A | 3/2018 |
| CN | 107810552 A | 3/2018 |
| CN | 108093656 A | 5/2018 |
| CN | 108615701 A | 10/2018 |
| KR | 2017-0095801 A | 8/2017 |
| KR | 20180076298 A | 7/2018 |
| WO | WO 2016/205078 A2 | 12/2016 |

OTHER PUBLICATIONS

German Office Action directed to German Patent Application No. 112018007788.8, mailed Feb. 2, 2024; 23 pages.

* cited by examiner

MULTIPLE-STACK THREE-DIMENSIONAL MEMORY DEVICE AND FABRICATION METHOD THEREOF

CROSS-REFERENCE TO RELATED APPLICATIONS

This application is a divisional application of U.S. patent application Ser. No. 16/126,919 filed on Sep. 10, 2018, which is a continuation of PCT/CN2018/097432 filed on Jul. 27, 2018, the entire contents of which are incorporated herein by reference.

BACKGROUND

Flash memory devices have undergone rapid development. Flash memory devices can store data for a considerably long time without powering, and have advantages such as high integration level, fast access, easy erasing, and rewriting. To further improve the bit density and reduce cost of flash memory devices, three-dimensional NAND flash memory devices have been developed.

A three-dimensional (3D) NAND memory device includes one or more stacks of word lines (or gate electrodes) arranged over a substrate, with a plurality of semiconductor channels, through and intersecting word lines, into the substrate. A stack of word lines includes word lines of different levels/tiers stacking along a direction perpendicular to the substrate, where a different level/tier represents a different height from the surface of the substrate.

A multiple-stack (or multiple-level) 3D NAND memory device often includes multiple stacks of word lines arranged along the direction perpendicular to the substrate. Channel holes are respectively formed in each stack for the subsequent formation of semiconductor channels through the multiple-stack 3D memory device. This arrangement can have the advantages of, e.g., allowing more memory cells to be formed along the direction perpendicular to the substrate, reducing the number of photomasks during staircase formation, and avoiding substrate over etch during high aspect ratio etches. To form this multiple-stack memory device, supporting pillars are used in the fabrication process to provide mechanical support and prevent pattern collapse. However, the fabrication processes of semiconductor channels and supporting pillars are time-consuming and costly.

BRIEF SUMMARY

Embodiments of three-dimensional memory device architectures and fabrication methods therefore are disclosed herein. The disclosed structures and methods provide numerous benefits, including, but not limited to simplifying the fabrication process, reducing the size of the three-dimensional memory device, and improving the space utility of the chip which the three-dimensional memory device is formed on.

In some embodiments, a memory device includes a substrate and a multiple-stack staircase structure. The multiple-stack staircase structure can include a plurality of staircase structures stacked over the substrate. Each of the plurality of staircase structures can include a plurality of conductor layers, and each of the plurality of conductor layers is located between two insulating layers. In some embodiments, the memory device also includes a filling structure surrounding the multiple-stack staircase structure, a semiconductor channel extending through the multiple-stack staircase structure, and a supporting pillar extending through the multiple-stack staircase structure and the filling structure. The semiconductor channel can include unaligned sidewall surfaces, and the supporting pillar can include aligned sidewall surfaces.

In some embodiments, the multi-stack staircase structure includes a first staircase structure over the substrate and a second staircase structure over the first staircase structure.

In some embodiments, the supporting pillar extends from a top surface of the second staircase structure to a bottom surface of the first staircase structure.

In some embodiments, supporting pillar and the semiconductor channel include same filling layers.

In some embodiments, the supporting pillar and the semiconductor channel is each filled with at least one of a charge trapping film, a semiconductor channel film, and a dielectric core.

In some embodiments, the supporting pillar and the semiconductor channel are filled with different filling layers.

In some embodiments, the supporting pillar is filled with at least one of an insulating material and a pillar-support material surrounded by the insulating material. In some embodiments, the semiconductor channel is filled with at least one of a charge trapping film, a semiconductor channel film, and a dielectric core.

In some embodiments, the insulating material includes silicon oxide and the metal material includes at least one of copper, cobalt, nickel, and aluminum.

In some embodiments, the memory device further includes a joint insulating layer between the first staircase structure and the second staircase structure, and an insulating cap layer over the second staircase structure.

In some embodiments, the memory device further includes a drain region over the semiconductor channel.

In some embodiments, the memory device further includes a connection layer in the semiconductor channel between two adjacent staircase structures. The connection layer can include a doped semiconductor material, and portions of the semiconductor channel separated by the connection layer can each form a semiconductor sub-channel.

In some embodiments, a method for forming a memory device includes forming a plurality of dielectric stacks stacked on one another over a substrate to create a multiple-stack staircase structure. Each one of the plurality of dielectric stacks can include a plurality of dielectric pairs arranged along a direction perpendicular to a top surface of the substrate. In some embodiments, the method further includes forming a multiple-stack staircase structure based on the plurality of dielectric stacks, forming a filling structure that surrounds the multiple-stack staircase structure, and forming a semiconductor channel extending through the multiple-staircase structure. The semiconductor channel can include unaligned sidewall surfaces. The method can further include forming a supporting pillar extending through at least one of the multiple-staircase structure and the filling structure. The supporting pillar can include aligned sidewall surfaces.

In some embodiments, forming the supporting pillar includes forming a photoresist layer over at least one of the filling structure and the multiple-stack staircase structure, and patterning the photoresist layer to form a patterned photoresist layer with an opening that exposes a portion of the filling structure. A location of the opening can correspond to a location of the supporting pillar. In some embodiments, forming the supporting pillar further includes using the patterned photoresist layer as an etch mask to etch through at least one of the filling structure and the multiple-stack staircase structure to form a pillar hole, wherein a bottom of the pillar hole contacts the substrate, and filling the pillar hole with a first material.

In some embodiments, forming the semiconductor channel includes forming a first sub-channel hole in a first dielectric stack of the plurality of dielectric stacks and filling the first sub-channel hole with a sacrificial filling material to form a sacrificial filling structure. The method further includes forming a second dielectric stack over the first dielectric stack and forming a second sub-channel hole in the second dielectric stack. In some embodiments, the second sub-channel hole aligns with the sacrificial filling structure along the direction perpendicular to the top surface of the substrate and the second sub-channel hole adjoins the first sub-channel hole to form a channel hole through the plurality of dielectric stacks and into the substrate. In some embodiments, the method also includes removing the sacrificial filling structure in the first sub-channel hole, and filling the channel hole with a second material.

In some embodiments, the first material is same as the second material and are formed by same fabrication operations, and the same fabrication operations includes sequentially depositing at least one of a charge trapping film, a semiconductor channel film, and a dielectric core into the channel hole and the pillar hole.

In some embodiments, the pillar hole is formed before a formation of the second sub-channel hole.

In some embodiments, the pillar hole is formed before the formation of the second sub-channel hole and after the sacrificial filling structure.

In some embodiments, the pillar hole is formed after a formation of the first sub-channel hole and the second sub-channel hole.

In some embodiments, the first material is different from the second material and is formed by a different deposition operation than the second material.

In some embodiments, the first material includes at least one of an insulating material and a pillar-support material surrounded by the insulating material, and the second material includes at least one of a charge trapping film, a semiconductor channel film, and a dielectric core.

In some embodiments, the insulating material includes silicon oxide and the pillar-support material includes at least one of copper, cobalt, nickel, and aluminum.

In some embodiments, forming the semiconductor channel includes forming a first semiconductor sub-channel in the first dielectric stack, forming a connection layer over the first semiconductor sub-channel, wherein the connection layer comprises a doped semiconductor material, and forming a second dielectric stack and a second semiconductor sub-channel in the second dielectric stack. The second semiconductor sub-channel can align with and adjoin the first semiconductor sub-channel to form a semiconductor channel extending through the plurality of dielectric stacks and into the substrate.

In some embodiments, forming the first semiconductor sub-channels includes forming a first sub-channel hole in the first dielectric stack of the plurality of dielectric stacks and depositing a second material into the first sub-channel hole. In some embodiments, forming the second semiconductor sub-channel hole includes forming the second dielectric stack over the first dielectric stack of the plurality of dielectric stacks and a second sub-channel hole in the second dielectric stack, and depositing the second material into the second sub-channel hole. The second sub-channel hole can align with and adjoin the first sub-channel hole along the direction perpendicular to the top surface of the substrate.

In some embodiments, the first material is same as the second material and are formed by same fabrication operations and the same fabrication operations includes sequentially depositing at least one of a charge trapping film, a semiconductor channel film, and a dielectric core into the channel hole and the pillar hole.

In some embodiments, the pillar hole is formed before a formation of the second sub-channel hole.

In some embodiments, the pillar hole is formed after the formation of the first semiconductor sub-channel and before the second sub-channel hole.

In some embodiments, the pillar holes are formed after a formation of the first semiconductor sub-channel and the second sub-channel hole.

In some embodiments, the first material is different from the second material and is formed by a different deposition operation than the second material.

In some embodiments, the first material includes at least one of an insulating material and a pillar-support material surrounded by the insulating material, and the second material includes at least one of a charge trapping film, a semiconductor channel film, and a dielectric core.

In some embodiments, the insulating material includes silicon oxide and the pillar-support material includes at least one of copper, cobalt, nickel, and aluminum.

In some embodiments, the pillar hole is formed after a formation of the multiple-stack staircase structure and the first sub-channel hole.

In some embodiments, a method for forming a memory device includes depositing a plurality of dielectric stacks one another over a substrate to form a multiple-dielectric-stack structure. Each one of the plurality of dielectric stacks can include a plurality of first material layer and second material layer alternatingly arranged along a direction perpendicular to a top surface of the substrate. The method can also include forming a first semiconductor sub-channel in a first dielectric stack of the plurality of dielectric stacks, and forming a second dielectric stack of the plurality of dielectric stacks over the first dielectric stack. The method can further include forming a second semiconductor sub-channel in the second dielectric stack. The second semiconductor sub-channel can align with the first semiconductor sub-channel along the direction perpendicular to the top surface of the substrate. The method can further include patterning the multiple-dielectric-stack structure to form a multiple-stack staircase structure.

In some embodiments, patterning the multiple-dielectric-stack structure includes a single staircase-forming patterning process.

In some embodiments, the staircase-forming patterning process includes forming a photoresist layer over the multiple-dielectric-stack structure, trimming the photoresist layer along a first direction parallel to a top surface of the substrate, and etching the multiple-dielectric-stack structure, using the trimmed photoresist layer as an etch mask to form a staircase.

In some embodiments, forming the first semiconductor sub-channel and the second semiconductor sub-channel include forming a first sub-channel hole in the first dielectric stack and a second sub-channel hole in the second dielectric stack, and filling the first sub-channel hole and the second sub-channel hole each with channel-forming layer.

In some embodiments, the channel-forming materials include at least one of a charge trapping film, a semiconductor channel film, and a dielectric core.

In some embodiments, the method further includes forming a joint insulating material layer between the first dielectric stack, forming an opening in the joint insulating material layer to expose the first semiconductor sub-channel, and performing a recess etch to remove a top portion of the channel-forming layers of the first semiconductor sub-channel and form a recess region. The method can also include forming a connection layer in the recess region and patterning the joint insulating material layer to form a joint insulating layer.

In some embodiments, forming the connection layer includes depositing a doped semiconductor material.

In some embodiments, the doped semiconductor material includes doped silicon.

In some embodiments, the method further includes forming a drain region over the second semiconductor sub-channel.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion. Multiple instances of an element may be duplicated where a single instance of the element is illustrated, unless absence of duplication of element is expressly described or clearly indicated otherwise.

DETAILED DESCRIPTION

Figure 1:
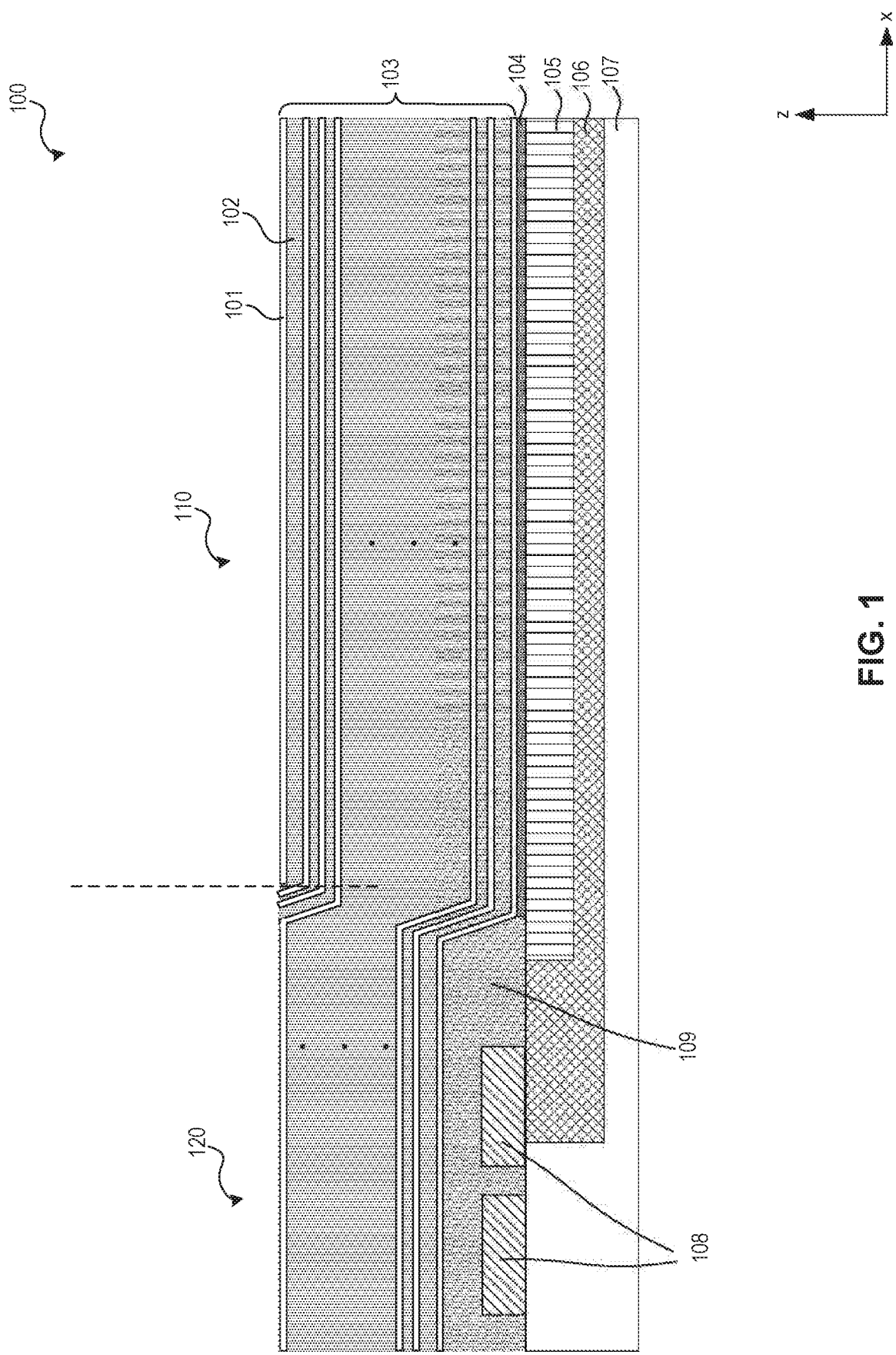
FIGS. 1-12 are each an illustration of a cross-sectional view of a 3D memory device at different stages of an exemplary fabrication process, according to some embodiments.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a sacrificial layer and the underlying insulating layer can together be referred to as "a tier," a word line and the underlying insulating layer can together be referred to as "a tier," word lines of substantially the same height can be referred to as "a tier of word lines" or similar, and so on.

The trend in three-dimensional NAND memory industry includes the reduction of device dimensions and the simplification of fabrication process. In a multiple-stack 3D memory device, word lines (control gate electrodes) of multiple stacks are arranged along a direction perpendicular to the top surface of a substrate. A "stack" refers to a pile of objects, arranged along a designated direction. These word lines are arranged to form a multiple-stack staircase structure. Memory cells for storing data are embedded in stacks of word lines, and the semiconductor channels formed through the stacks of word lines. This configuration allows more memory cells to be formed within a unit area.

To form a multiple-stack 3D NAND memory device, word lines of different tiers in different stacks are formed by replacing sacrificial material layers with a conductive material in the multiple-stack staircase structure. Supporting pillars are formed through the multiple-stack staircase structure to prevent pattern collapse during the formation of word lines. In an example, multiple dielectric stacks or multiple stacks of dielectric pairs (e.g., sacrificial material layer/insulating material layer pairs) are formed sequentially along a direction perpendicular to the surface of a substrate. The multiple dielectric stacks can include the same number of different numbers of dielectric stairs, e.g., 32 tiers, 48 tiers, and 64 tiers. The dielectric stack at the bottom (e.g., a lower dielectric stack that is closest to the top surface of the substrate) is first formed, and sub-channel holes and sub-pillar holes are formed in this stack. A patterning process is performed on the dielectric pairs of the lower dielectric stack to form a staircase structure (e.g., a lower staircase structure). Another dielectric stack is then formed over the lower dielectric stack and undergoes a similar fabrication process to form an upper staircase structure with sub-channel holes and sub-pillar holes. The sub-channel holes and the sub-pillar holes in the upper staircase structure align and adjoin the sub-channel holes and the sub-pillar holes in the lower staircase structure along the direction perpendicular to the surface of the substrate. The upper staircase structure and the lower staircase structure form the multiple-stack staircase structure. The adjoined sub-channel holes and adjoined sub-pillar holes are then filled with suitable materials to form semiconductor channels and supporting pillars, respectively. In the present disclosure, sub-channel holes and sub-pillar holes respectively refer to the cavity structures formed in one dielectric stack/staircase structure, and are used to merely distinguish the channel hole and pillar hole (adjoined cavity structure) through the multiple-stack staircase structure. The terms "sub-channel hole" and "sub-pillar hole" do not imply any difference in other aspects such as fabrication order or functions.

In this fabrication process, dielectric stacks (e.g., upper dielectric stack and lower dielectric stack) are patterned separately to form respective staircase structures (e.g., upper staircase structure and lower staircase structure), and separate photomasks are used to perform the patterning processes. Sub-channel holes and sub-pillar holes of different staircase structure are formed before the deposition of next dielectric stack. Semiconductor channels and supporting pillars through the multiple-stack staircase structure are then often formed by respectively adjoining sub-channel holes and sub-pillar holes of adjacent dielectric staircase structures along the direction perpendicular to the surface of the substrate and filling the adjoined sub-channel holes and sub-pillar holes with suitable materials, such as materials that fill semiconductor channels.

The fabrication process described above can have several issues. First, because a different photomask (or a different set of photomasks) is often used to pattern sub-channel holes and sub-pillar holes of each dielectric stack, the number of photomasks and corresponding photolithography operations used to form multiple-stack staircase structures can be undesirably large, increasing cost and processing time of the fabrication process. Second, because an upper dielectric stack is often formed after the formation of the lower staircase structure and its dielectric filling structure (e.g., the lower dielectric filling structure), processing (e.g., etching) on the lower staircase and the lower dielectric filling structure often affect film qualities of the upper dielectric stack. For example, topography of the lower staircase and the lower dielectric filling structure can cause defects in the upper dielectric stack, adversely affect the film quality of the upper dielectric stack. Third, sub-channel holes and sub-pillar holes of the same dielectric stack often have different dimensions and are often formed from the same patterning/etching process, making it challenging to form them together with high uniformity, Further, because channel holes and pillar holes through the multiple-stack staircase structure are formed by adjoining sub-channel holes and sub-pillar holes of each staircase structure along the direction perpendicular to the surface of the substrate, the etching and aligning of sub-channel holes and sub-pillar holes may require higher precision control.

Inner sidewall (or sidewall) of a pillar hole through the memory structure can be formed by respectively adjoining sidewalls of supporting pillars of the multiple staircase structures stacked together. A supporting pillar formed by the fabrication processes described above can be referred to having an "adjoined/connected sidewall," which can include one or more connection portion formed by the adjoining of sub-pillar holes (e.g., at the interface of two adjoined sidewalls). The sidewall can thus have unaligned (or disjointed) surfaces at the connection portions. The unaligned surfaces can refer to the inconsistent hole dimensions caused by etching holes with high aspect-ratio (e.g., greater than 4). For example, when a first sub-pillar hole adjoins a second sub-pillar hole underneath, the diameter of the bottom of the first sub-pillar hole can be smaller than the diameter of the top of the second sub-pillar hole, creating unaligned surfaces along the vertical direction at the adjoining interface. In contrast, a pillar hole formed without adjoining sub-pillar holes can be referred to having a sidewall of aligned (or non-disjointed) surfaces. For example, the pillar hole formed by the present disclosure can extend through the memory structure and can have aligned sidewall surfaces.

For simplicity, the fabrication process of repeatedly etching dielectric pairs of a dielectric stack to from a staircase structure based on the dielectric stack is referred to as a "staircase-forming patterning" process. Each staircase-forming pattern can include a plurality of repeated etching/patterning of dielectric pairs of the respective dielectric stack. In some embodiments, two staircase-forming patterning processes are often employed to form a two-stack staircase structure.

The present disclosure describes structures and methods for forming a 3D memory device. According to the disclosed structures and methods, dielectric pairs of multiple stacks that form a multiple-stack memory device are patterned by one staircase-forming patterning process to form the multiple-stack staircase structure. Etching of the dielectric pairs of the multiple dielectric stacks can be performed after the dielectric pairs of the multiple dielectric stacks are deposited. Pillar holes through the multiple-stack staircase structure can be formed after the formation of the multiple-stack staircase structures by one patterning process. Pillar holes can be formed, e.g., before or after the formation of the channel holes of the upper dielectric stack. Supporting pillars of the memory device can be formed by filling the pillar holes with any suitable materials, e.g., the same material that forms the semiconductor channels employing the film deposition of semiconductor channels. Similar processes can also be used to form supporting pillars in a double-channel memory device.

By using the disclosed structures and methods, multiple-stack staircase structures can be formed by one staircase-forming patterning process, thereby avoiding multiple patterning of different dielectric stacks. A reduced number of photomasks and photolithography processes can be used to form multiple-stack staircase structures with semiconductor channels and supporting pillars. The formation of 3D memory devices can be simplified and less time consuming. Meanwhile, formation of supporting pillars is compatible with the formation of multiple-stack staircase structures. Less patterning is needed for the formation of supporting pillars and the fabrication process of the 3D memory device is thus simplified and less costly which can in turn improves device yield and performance.

For illustrative purposes, a 3D NAND memory device is used to describe the present disclosure. The exemplary 3D NAND memory device includes an upper stack of word lines and a lower stack of word lines, which are respectively formed from an upper dielectric stack and a lower dielectric stack. The disclosed methods can be used to form any suitable multiple-stack memory device with an increased number of stacks. In various embodiments, the upper dielectric stack can represent the last dielectric stack of the multiple dielectric stacks.

In the present disclosure, a "staircase structure" or a "stepped cavity structure," or similar refer to a structure having stepped surfaces. In the present disclosure, "stepped surfaces" refer to a set of surfaces that include at least two horizontal surfaces (e.g., along x-y plane) and at least two (e.g., first and second) vertical surfaces (e.g., along the z axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the figures of the present disclosure, x axis propagates along a direction perpendicular to the y-z plane.

In the present disclosure, a dielectric stack or a stack of dielectric pairs refers to a pile of (or a plurality of) dielectric pairs stacked along the direction perpendicular to the top surface of the substrate. The dielectric stack can undergo a patterning and/or etching process to form a staircase structure. For example, a lower/bottom dielectric stack can be patterned/etched to form a lower/bottom staircase structure, and so on. Accordingly, multiple dielectric stacks, one on top of another over the substrate, can be patterned/etched to form a multiple-stack staircase structure. Channel holes formed in each staircase structure can align with and adjoin channel holes of adjacent (e.g., upper or lower) staircase structure to form adjoined/combined channel holes through the multiple-stack staircase structure. The term "through" an object refers to being from the top surface/portion to the bottom surface/portion of the object. For example, channel holes through each staircase structure can be adjoined to form channel holes through the multiple-stack staircase structure, and pillar holes can be formed to be through the memory structure. For descriptive simplicity, "multiple-stack staircase structure" can be interchangeable with "staircase structure" in the embodiments.

Fabrication processes to form a 3D memory device are illustrated. FIGS. 1-6 illustrate exemplary processes to form supporting pillars through a multiple-stack staircase structure of a 3D multiple-stack memory device, and FIGS. 7-12 illustrate an exemplary process to form the multiple-stack staircase structure in the 3D multiple-stack memory device.

FIG. 1 illustrates a cross-sectional view of a memory structure 100 at the beginning of a fabrication process to form a 3D NAND memory device, according to some embodiments. As shown in FIG. 1, memory structure 100 includes a substrate 107, a first doped region 106 in substrate 107, a second doped region 105 in first doped region 106, a dielectric layer 104 over substrate 107, a plurality of transistors 108 over substrate 107 and covered by an isolation layer 109, and a first dielectric stack 103 over dielectric layer 104 and isolation layer 109. Memory structure 100 can be divided into a core region 110 and a periphery region 120, for illustrative purposes. Periphery region 120 can include the plurality of transistors 108 for providing control signals and can surround core region 110. Periphery region 120 can also be under core region 110, depending on the type of the memory device.

In core region 110, first dielectric stack 103 (e.g., lower dielectric stack) can include a plurality of dielectric pairs repeatedly arranged along a direction perpendicular to the top surface of substrate 107 (e.g., the z axis). A dielectric pair can include a sacrificial material layer and an insulating material layer. First dielectric stack 103 can include sacrificial material layers and insulating material layers alternatingly stacked along the z axis. In a dielectric pair, 102 and 101 can each be one of a sacrificial material layer and an insulating material layer. In the present disclosure, 102 represents an insulating material layer and 101 represents a sacrificial material layer. The sacrificial material layers 101 and the insulating material layers 102 can include different materials. In some embodiments, sacrificial material layers 101 includes silicon nitride and insulating material layers 102 include silicon oxide. In subsequent fabrication processes, memory cells can be formed in core region 110. In some embodiments, dielectric layer 104 is a gate dielectric layer and includes a suitable oxide, e.g., silicon oxide.

Periphery region 120 includes any peripheral devices (e.g., represented by transistors 108), isolation layer 109 over the peripheral devices, and a plurality of dielectric pairs repeatedly arranged over the peripheral devices. Isolation layer 109 can include any suitable insulating materials (e.g., silicon oxide) and can protect and isolate the peripheral devices from other devices or structures. In some embodiments, first doped region 106 includes a deep N-well (DNW) and second doped region 105 includes a high-voltage P well (HVPW). For illustrative purposes, only elements relevant to the present disclosure are depicted and labeled in the figures. In some embodiments, peripheral devices are formed prior to the deposition of first dielectric stack 103. Due to the height of the peripheral devices, dielectric pairs of first dielectric stack 103 can have a vertical shift in the height between core region 110 and peripheral region 120.

In some embodiments, substrate 107 includes any suitable material for forming the three-dimensional memory device. For example, substrate 107 can include silicon, silicon germanium, silicon carbide, silicon on insulator (SOI), germanium on insulator (GOI), glass, gallium nitride, gallium arsenide, and/or other suitable III-V compound. First doped region 106 and second doped region 105 can each be formed by a suitable doping process such as ion implantation.

Memory structure 100 provides the base for the fabrication of the 3D memory device and can be formed using any suitable processes. For example, memory structure 100 can be formed by depositing a dielectric material stack (not shown) over substrate 107 and planarizing the dielectric material stack. In some embodiments, substrate 107 with first doped region 106 and second doped region 105 is provided, and peripheral devices (e.g., the plurality of transistors 108) and isolation layer 109 are formed over substrate 107. A dielectric film can be deposited over substrate 107 and patterned to form dielectric layer 104. A dielectric material stack can be formed over dielectric layer 104 and isolation layer 109 by alternatingly depositing insulating material layers 102 and sacrificial material layers 101 over substrate 107. Sacrificial material layer 101 and insulating material layer 102 can have same or different thicknesses. A sacrificial material layer 101 can include any suitable material different from an insulating material layer 102. For example, in some embodiments, sacrificial material layers 101 can include poly-crystalline silicon, silicon nitride, poly-crystalline germanium, and/or poly-crystalline germanium-silicon. In some embodiments, sacrificial material layers 101 include silicon nitride. Insulating material layers 102 can include any suitable insulating materials, e.g., silicon oxide. The deposition of sacrificial material layers 101 and insulating material layers 102 can include any suitable deposition methods such as plasma-enhanced CVD (PECVD), sputtering, atomic layer deposition (ALD), and so on.

Further, a planarization process can be performed to planarize the dielectric material stack into a suitable thickness. First dielectric stack 103 can thus be formed. In some embodiments, the top surface of core region 110 levels with the top surface of periphery region 120. In some embodiments, sacrificial material layer 101 is exposed in core region 110 by the planarization process. In some embodiments, the planarization process includes a chemical mechanical planarization (CMP) process.

Figure 2:
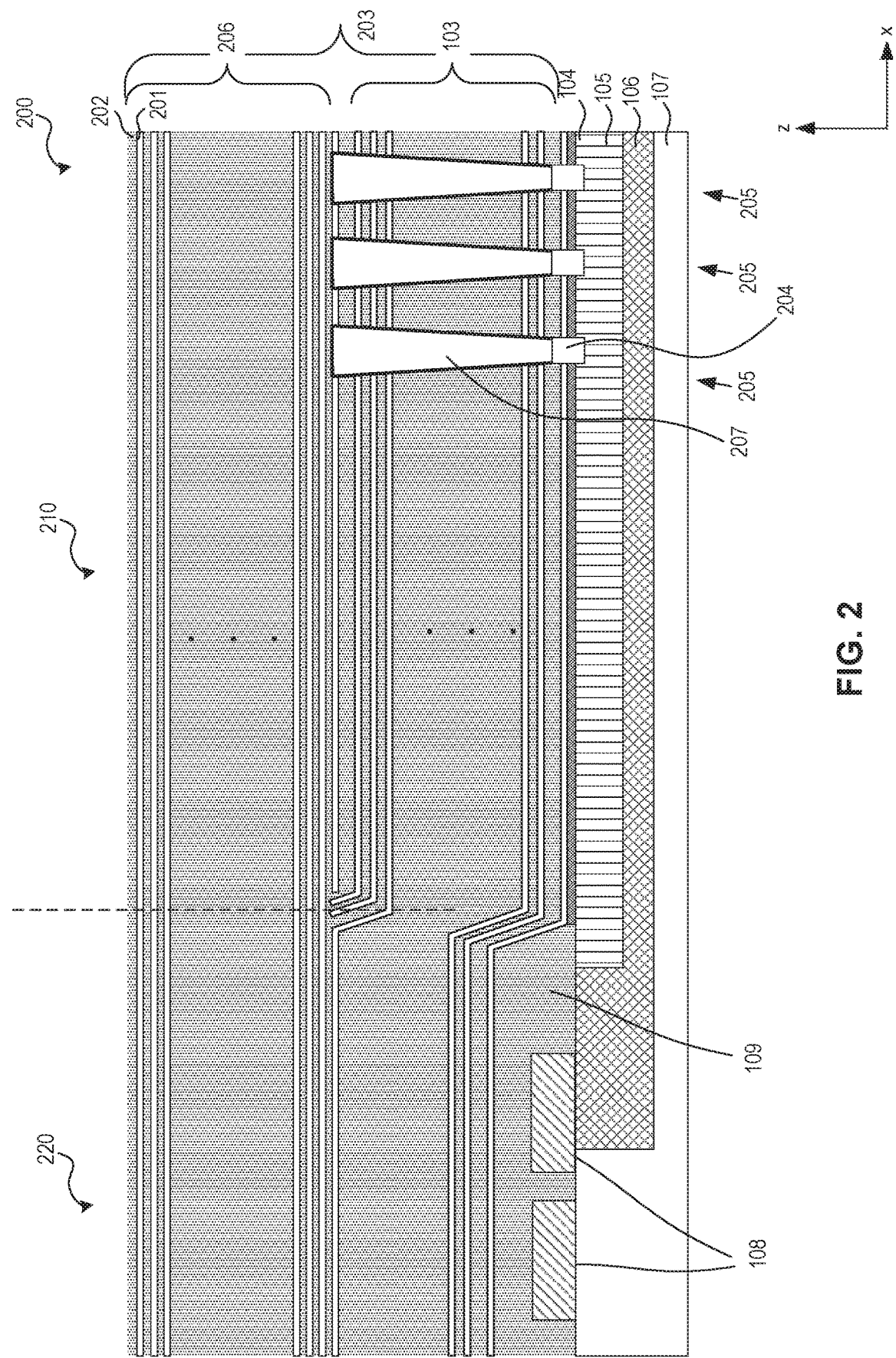

FIG. 2 illustrates a cross-sectional view of memory structure 200 formed based on memory structure 100, according to some embodiments. As shown in FIG. 2, memory structure 200 can be formed by forming a plurality of first sub-channel holes 205 in first dielectric stack 103, filling first sub-channel holes 205 with a sacrificial filling structure 207, and forming a second dielectric stack 206 (e.g., upper dielectric stack) over first dielectric stack 103. First dielectric stack 103 and second dielectric stack 206 can form two-stack dielectric stack 203 (the term "dielectric stack 203" can also refer to two-stack dielectric stack 203). For illustrative purposes, memory structure 200 is divided into core region 210 and periphery region 220, each respectively corresponding to core region 110 and periphery region 120 of FIG. 1. In some embodiments, the top surface of core region 210 levels with the top surface of periphery region 220.

Memory structure 200 can be formed using any suitable processes. In some embodiments, first sub-channel holes 205 are first formed in first dielectric stack 103 before second dielectric stack 206 is deposited thereon. First sub-channel holes 205 can be formed by, e.g., patterning a photoresist layer using photolithography over first dielectric stack 103 to form openings in the patterned photoresist layer, and performing an etching process to remove the dielectric materials in first dielectric stack 103 defined by the openings. The locations of the openings can correspond to the locations of first sub-channel holes 205. The etching process can include any suitable wet etch and/or dry etch. In some embodiments, an anisotropic etch is performed to remove the materials vertically (e.g., along the z axis). First sub-channel holes 205 can extend through first dielectric stack 103 and substantially into second doped region 105 and/or extend into substrate 107. In some embodiments, first sub-channel holes 205 can have a substantially rectangular cross-section shape. In some embodiments, first sub-channel holes 205 can have a substantially trapezoidal cross-section shape. In some embodiments, the horizontal dimension (e.g., along the x axis) of first sub-channel hole 205 can, e.g., decrease towards the substrate due to fabrication processes. Any variation of the shape of first sub-channel hole 205 is still within the scope of the present disclosure.

A sacrificial filling material can further be deposited to fill in first sub-channel holes 205. Any suitable deposition process can be performed to deposit the sacrificial filling material into first sub-channel holes 205 and other areas over first dielectric stack 103. The sacrificial filling material deposited in first sub-channel hole 205 can form sacrificial filling structure 207. Any suitable planarization method (e.g., CMP) and/or recess etch (e.g., dry etch and/or wet etch) can be performed to remove any excessive sacrificial filling material over first dielectric stack 103. The sacrificial filling material can include any suitable non-conductive material (e.g., amorphous silicon, polysilicon, silicon germanium, amorphous carbon, silicon nitride, diamond-like carbon, and porous organosilicate glass), and can be deposited by any suitable deposition method such as CVD and/or spin coating.

In some embodiments, an insulating layer (not shown in FIG. 2) can be deposited over first dielectric stack 103. The insulating layer can include a suitable insulating material such as one or more materials that form first dielectric stack 103. The insulating layer can be formed before the formation of first sub-channel holes 205 or after the deposition of the sacrificial filling material. If the insulating layer is formed before the formation of first sub-channel holes 205, the formation of first sub-channel holes 205 can include forming openings in the insulating layer and removing portions of first dielectric stack 103 exposed by the openings. A suitable planarization method (e.g., CMP) and/or recess etch (e.g., dry etch and/or wet etch) can be performed to remove any excessive material of the insulating layer over first dielectric stack 103.

In some embodiments, a channel epitaxial portion 204 can be formed at the bottom of a first sub-channel hole 205 by a suitable deposition process. Channel epitaxial portion 204 can function as a portion of a semiconductor channel. For example, a selective epitaxial deposition can be performed to deposit a semiconductor material at the bottom of first sub-channel hole 205. In some embodiments, channel epitaxial portion 204 includes a single crystalline semiconductor in epitaxial alignment (e.g., same crystal orientation) with second doped region 105. In some embodiments, channel epitaxial portion 204 includes single crystalline silicon. The top surface of channel epitaxial portion 204 can be between a pair of sacrificial material layers 101 and the periphery of epitaxial channel portion 204 can be in physical contact with insulating material layers 102.

Further, second dielectric stack 206 can be formed over first dielectric stack 103. In some embodiments, second dielectric stack 206 is formed over core region 210 and periphery region 220. Second dielectric stack 206 can include a plurality of dielectric pairs, each including a sacrificial material layer 201 and an insulating material layer 202. Sacrificial material layers 201 and insulating material layers 202 can be arranged alternatingly along the z axis. First dielectric stack 103 and second dielectric stack 206 can form a dielectric stack 203. The structure and deposition methods to form second dielectric stack 206 can refer to the structure and deposition methods of first dielectric stack 103.

Figure 3:
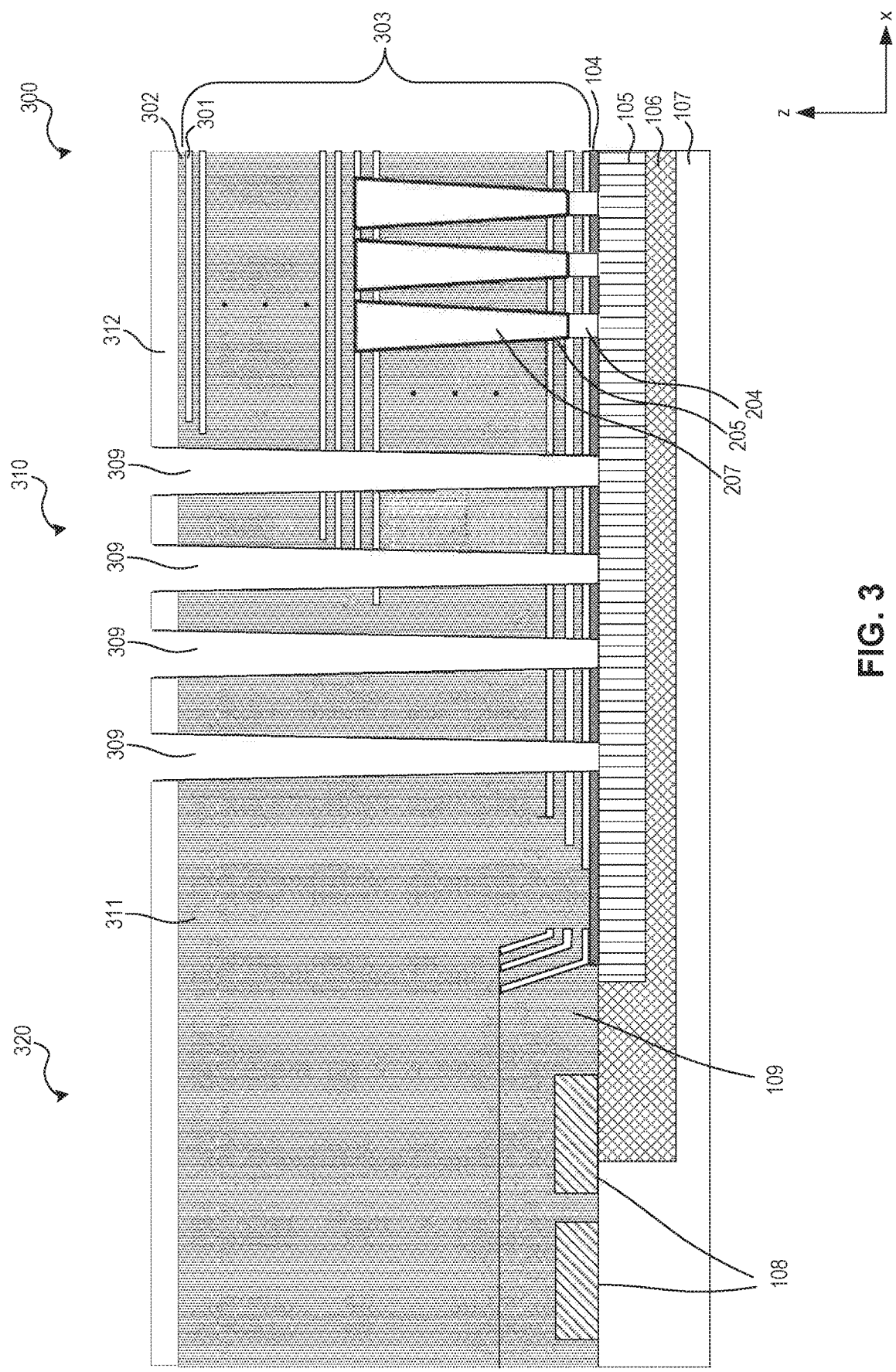

FIG. 3 illustrates an exemplary memory structure 300 formed based on memory structure 200, according to some embodiments. As shown in FIG. 3, memory structure 300 can be formed by forming a two-stack staircase structure 303 from dielectric stack 203, filling space formed by the formation of staircase structure 303 with a dielectric filling structure 311, and forming a plurality of pillar holes 309. For illustrative purposes, memory structure 300 is divided into core region 310 and periphery region 320, each respectively corresponding to core region 210 and periphery region 220 of FIG. 2.

The portion of dielectric stack 203 in periphery region 320 can be removed and the top surface of isolation layer 109 can be exposed. Staircase structure 303 can be formed by repetitively patterning/etching sacrificial material layers 201 and insulating material layers 202 of dielectric stack 203 in core region 310. Dielectric pairs of different tiers can be etched to form staircases extending along the x-y plane. Each staircase can include an insulating layer (e.g., 302) and a pairing sacrificial layer (e.g., 301). The dielectric stacks can be patterned/etched through one staircase-forming patterning process to form staircase structure 303 (or multiple-stack staircase structure 303 or two-stack staircase structure 303). Details of the formation of staircase structure 303 are described in FIGS. 7-12.

Further, a dielectric filling material can be deposited after staircase structure 303 is formed to fill in the space formed by the removal of the portions of dielectric stack 203. Dielectric filling structure 311 is deposited in periphery region 320 and core region 310 to fill in the space formed by the removal of the portions of dielectric stack 203. A suitable planarization method (e.g., CMP and/or recess etch) can be performed to remove any excessive dielectric filling material overlying the topmost surface of staircase structure 303. The remaining portion of the deposited dielectric filling material (e.g., over staircase structure 303 and isolation layer 109) can form dielectric filling structure 311 that surrounds staircase structure 303. Dielectric filling structure 311 can be retro-stepped. In the present disclosure, a retro-stepped element refers to an element that has stepped surfaces and a horizontal cross-section area that increases monotonically as a function of a vertical distance from a top surface of a substrate on which the element is present. Dielectric filling structure 311 can include any suitable dielectric material that provides electrical insulation for staircase structure 300 and can be deposited by any suitable deposition methods such as CVD, ALD, and/or PVD. In some embodiments, dielectric filling structure 311 includes silicon oxide and is formed by CVD. An insulating cap material layer can be deposited to cover staircase structure 303 and dielectric filling structure 311. The insulating cap material layer can have sufficient thickness along the z axis to allow drain regions to be formed within. The insulating cap material layer can include any suitable insulating material such as silicon oxide.

Further, pillar holes 309 can be formed in memory structure 300. Pillar holes 309 can be formed in any suitable location in core region 310, e.g., intersecting with staircase structure 303. In some embodiments, pillar holes 309 can be formed adjacent to first sub-channel holes 205. In some embodiments, pillar holes 309 can be formed in the staircase structure. In some embodiments, some pillar holes 309 can be formed in a portion of peripheral region 320. Pillar holes 309 can be formed by, e.g., patterning a photoresist layer using photolithography over the insulating cap material layer over staircase structure 303 and dielectric filling structure 311 to form openings in the patterned photoresist layer that correspond to the locations of pillar holes 309, and performing an etching process (e.g., using the patterned photoresist layer as an etch mask) to remove the portions of insulating cap material layer and portions of staircase structure 303 exposed/defined by the openings. The etching process can include any suitable wet etch and/or dry etch. In some embodiments, an anisotropic etch is performed to etch portions of the insulating cap material layer, staircase structure 303 and dielectric filling structure 311 to form pillar holes 309. The patterned photoresist layer can then be removed after the formation of pillar holes 309. Insulating cap layer 312 can then be formed. Pillar hole 309 can extend from a top surface of insulating cap layer 312 to substrate 107. The cross-section of pillar hole 309 along the x-z plane can have a trapezoid shape. In some embodiments, a horizontal dimension (e.g., along the x axis) of pillar hole 309 can, e.g., decrease towards the substrate due to fabrication processes. Any variation of the shape of pillar hole 309 is still within the scope of the present disclosure. In some embodiments, pillar holes 309 are formed before the formation of second sub-channel holes of upper dielectric stack. In some embodiments, pillar holes 309 are formed after the formation of second sub-channel holes of upper dielectric stack.

Figure 4:
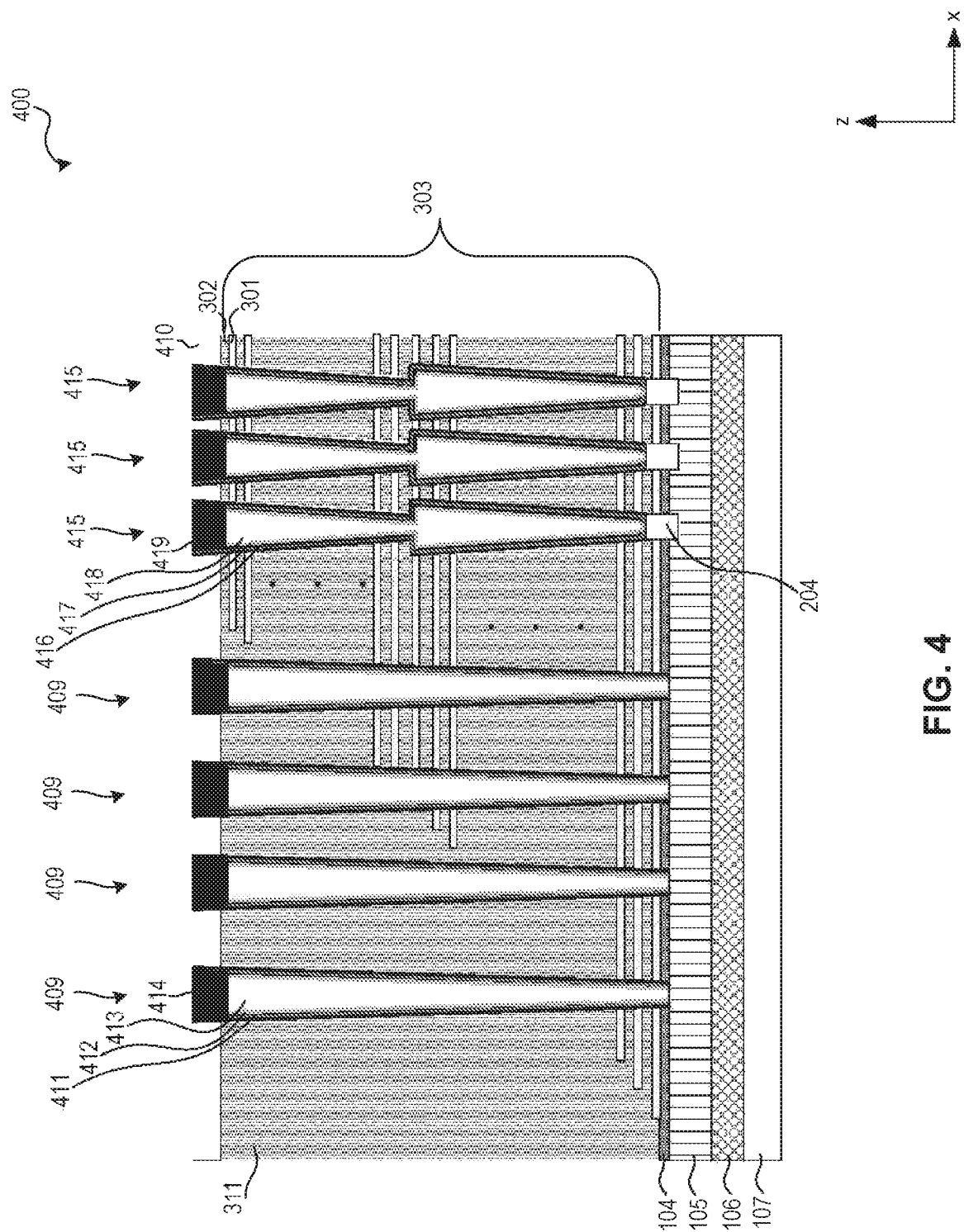

FIG. 4 illustrates an exemplary memory structure 400 formed based on memory structure 300, according to some embodiments. As shown in FIG. 4, memory structure 400 can be formed by forming a plurality of second sub-channel holes over first sub-channel holes 205, filling the first and second sub-channel holes and pillar holes 309 to form semiconductor channels 415 and supporting pillars 409, and forming drain regions 419 over semiconductor channels 415 and dummy drain regions 414 over supporting pillars 409. For illustrative purposes, core region is described in FIG. 4.

To form second sub-channel holes, a photoresist layer can be formed over insulating cap layer 410. The photoresist layer can cover/close the top portions of pillar holes 309 so that the subsequent etching of second sub-channel holes has little or no impact on pillar holes 309. The photoresist layer can then be patterned to form openings that expose portions of insulating cap layer 410 and correspond to the locations of the second sub-channel holes. The patterned photoresist layer can be used as an etch mask to remove portions of insulating cap layer 410 and portions of staircase structure 303 exposed/defined by the openings. Insulating cap layer 410 can be formed. The horizontal projection (e.g., on the x-y plane) of the second sub-channel holes can substantially overlap with the horizontal projection of first sub-channel holes 205. In some embodiments, the second sub-channel holes substantially align with respective first sub-channel holes 205 along the z axis. In some embodiments, the number of second sub-channel holes equals to the number of first sub-channel holes 205, and the horizontal projection of each second sub-channel hole overlaps with the horizontal projection of a respective first sub-channel hole 205 underneath. The patterned photoresist layer can then be removed after the formation of the second sub-channel holes.

In some embodiments, the second sub-channel holes can each adjoin respective first sub-channel hole 205 so that the formed channel hole combines the volumes of first sub-channel hole 205 and the respective second sub-channel hole, and extends through staircase structure 303. In some embodiments, the bottom of second sub-channel hole exposes sacrificial filling structure 207 of the respective first sub-channel hole 205.

Inner sidewall (or sidewall) of a channel hole extending through staircase structure 303 can be formed by respectively adjoining sidewalls of first sub-channel holes 205 and respective second sub-channel holes stacked together. A semiconductor channel formed by these fabrication operations can be referred to having an "adjoined/connected sidewall," which can include one or more connection portion formed by the adjoining of sub-pillar holes (e.g., at the interface of two adjoined sidewalls). The sidewall can thus have unaligned surfaces at the connection portions. The unaligned surfaces can refer to the inconsistent hole dimensions caused by etching holes with high aspect-ratio (e.g., greater than 4). For example, when a second sub-channel hole adjoins a first sub-channel hole, the diameter of the bottom of the second sub-channel hole can be smaller than the diameter of the top of the first sub-pillar hole, creating unaligned surfaces along the vertical direction at the adjoining interface. In contrast, a channel hole formed without adjoining sub-pillar holes can be referred to having a sidewall of aligned surfaces. For example, the channel hole formed by the present disclosure can extend through the memory structure and can have unaligned sidewall surface.

Sacrificial filling structures 207 can then be removed by a suitable etching process (e.g., dry etch and/or wet etch). For example, a selective etch can be performed. The selective etch can be an isotropic etching process or an anisotropic etching process.

Further, channel holes and pillar holes 309 can be filled by the same fabrication operations (e.g., at the same time). A series of channel-forming layers can be sequentially deposited into the channel holes (e.g., having the combined volume of first sub-channel holes 205 and adjoined second sub-channel holes) and pillar holes 309 to fill in the channel holes and pillar holes 309.

In some embodiments, a charge trapping film 416 (e.g., or sacrificial film) is deposited over the sidewall of channel holes and pillar holes 309. Charge trapping film 416 can include one or more block dielectric layers over the sidewall of channel hole to insulate other layers in the channel hole from staircase structure 303. Charge trapping film 416 can also include a storage unit layer (memory layer) over and surrounded by the block dielectric layers for trapping charges and forming a plurality of charge storage regions along the z axis. Charge trapping film 416 can also include a tunneling layer (e.g., tunneling dielectric) over and surrounded by the memory layer. Charge tunneling can be performed through the tunneling layer under a suitable electric bias.

The one or more block dielectric layers can include a first block layer, which includes a dielectric metal oxide layer with a relatively high dielectric constant. The term "metal oxide" can include a metallic element and non-metallic elements such as oxygen, nitrogen, and other suitable elements. For example, the dielectric metal oxide layer can include aluminum oxide, hafnium oxide, lanthanum oxide, yttrium oxide, tantalum oxide, silicates, nitrogen-doped compounds, alloys, etc. The first block layer can be deposited, for example, by CVD, ALD, pulsed laser deposition (PLD), liquid source misted chemical deposition, and/or other suitable deposition methods.

The one or more block dielectric layers can also include a second block layer, which includes another dielectric layer over the dielectric metal oxide. The other dielectric layer can be different from the dielectric metal oxide layer. The other dielectric layer can include silicon oxide, a dielectric metal oxide having a different composition than the first block layer, silicon oxynitride, silicon nitride, and/or other suitable dielectric materials. The second block layer can be deposited, for example, by low pressure chemical vapor deposition (LPCVD), ALD, CVD, and/or other suitable deposition methods. In some embodiments, the one or more block dielectric layers include silicon oxide, which is formed by CVD.

The storage unit layer can be sequentially formed over the one or more block dielectric layers. The storage unit layer can include a charge trapping material, e.g., a dielectric charge trapping material (e.g., silicon nitride) and/or a conductive material (e.g., doped polysilicon). In some embodiments, the dielectric charge trapping material includes silicon nitride and can be formed by CVD, ALD, PVD, and/or other suitable deposition methods.

The tunneling layer can be sequentially formed over the memory layer. The tunneling layer can include silicon oxide, silicon nitride, silicon oxynitride, dielectric metal oxides, dielectric metal oxynitride, dielectric metal silicates, alloys, and/or other suitable materials. The tunneling layer can be formed by CVD, ALD, PVD, and/or other suitable deposition methods. In some embodiments, the tunneling layer includes silicon oxide, which is formed by CVD.

Further, a semiconductor channel film 417 can be formed over charge trapping film in channel holes and pillar holes 309. Semiconductor channel film 417 can include one or more layers of any suitable semiconductor materials such as silicon, silicon germanium, germanium, III-V compound material, II-VI compound material, organic semiconductor material, and/or other suitable semiconductor materials. Semiconductor channel film 417 can be formed by a suitable deposition method such as metal-organic chemical vapor deposition (MOCVD), LPCVD, CVD, and/or other suitable deposition methods. In some embodiments, semiconductor channel film 417 is formed by depositing a layer of amorphous silicon using CVD, followed by an annealing process such that the amorphous silicon is converted to single-crystalline silicon. In some embodiments, other amorphous material can be annealed to be crystallized to form semiconductor channel film 417.

Further, dielectric core 418 can be formed by depositing a suitable dielectric material over semiconductor channel films in channel holes and pillar holes. Dielectric core 418 can fill in the space at the center of the channel hole and the pillar hole. Dielectric core 418 can include a suitable dielectric material such as silicon oxide and/or organosilicate glass. Dielectric core 418 can be formed by a suitable conformal deposition method (e.g., LPCVD) and/or self-planarizing deposition method (e.g., spin coating). In some embodiments, dielectric core 418 includes silicon oxide and is formed by LPCVD. In some embodiments, a suitable planarization process (e.g., CMP and/or recess etch) is performed to remove any excessive materials over the top of staircase structure 303.

When different layers (e.g., charge trapping film 416, semiconductor channel film 417, and dielectric core 418) are being formed in the channel holes, the materials for forming those layers can also be respectively deposited in pillar holes 309. Because these layers have little or no active electrical functions, for illustrative purposes, these layers in pillar holes 309 are referred to as dummy charge trapping films 411, dummy semiconductor channel films 417, and dummy dielectric cores 413. Supporting pillars 409 can thus be formed.

Further, top portions of supporting pillars 409 and semiconductor channels 415 can be removed by any suitable recess etching processes. In some embodiments, a selective etch is performed to remove top portions of supporting pillars 409 and semiconductor channels 415. In some embodiments, the depth of the recess region is substantially equal to the thickness of insulating cap layer 410.

Further, drain regions 419 (e.g., over semiconductor channels 415) and dummy drain regions 414 (e.g., over supporting pillars 409) can be formed in the recess regions. Drain regions 419 and dummy drain regions 414 can be formed by, e.g., depositing a doped semiconductor material in the recess regions. The deposition can include any suitable deposition methods, such as CVD and/or area selective deposition (ASD). Optionally, an ion implantation process is employed to adjust the doping level of the recess region. The doped semiconductor material can include, for example, doped polysilicon. The doped semiconductor material can have a conductivity type that is opposite from the conductivity type of substrate 107. Excess portions of the deposited doped semiconductor material can be removed from above the top surface of insulating cap layer 410 by, e.g., CMP and/or a recess etch.

Figure 5:
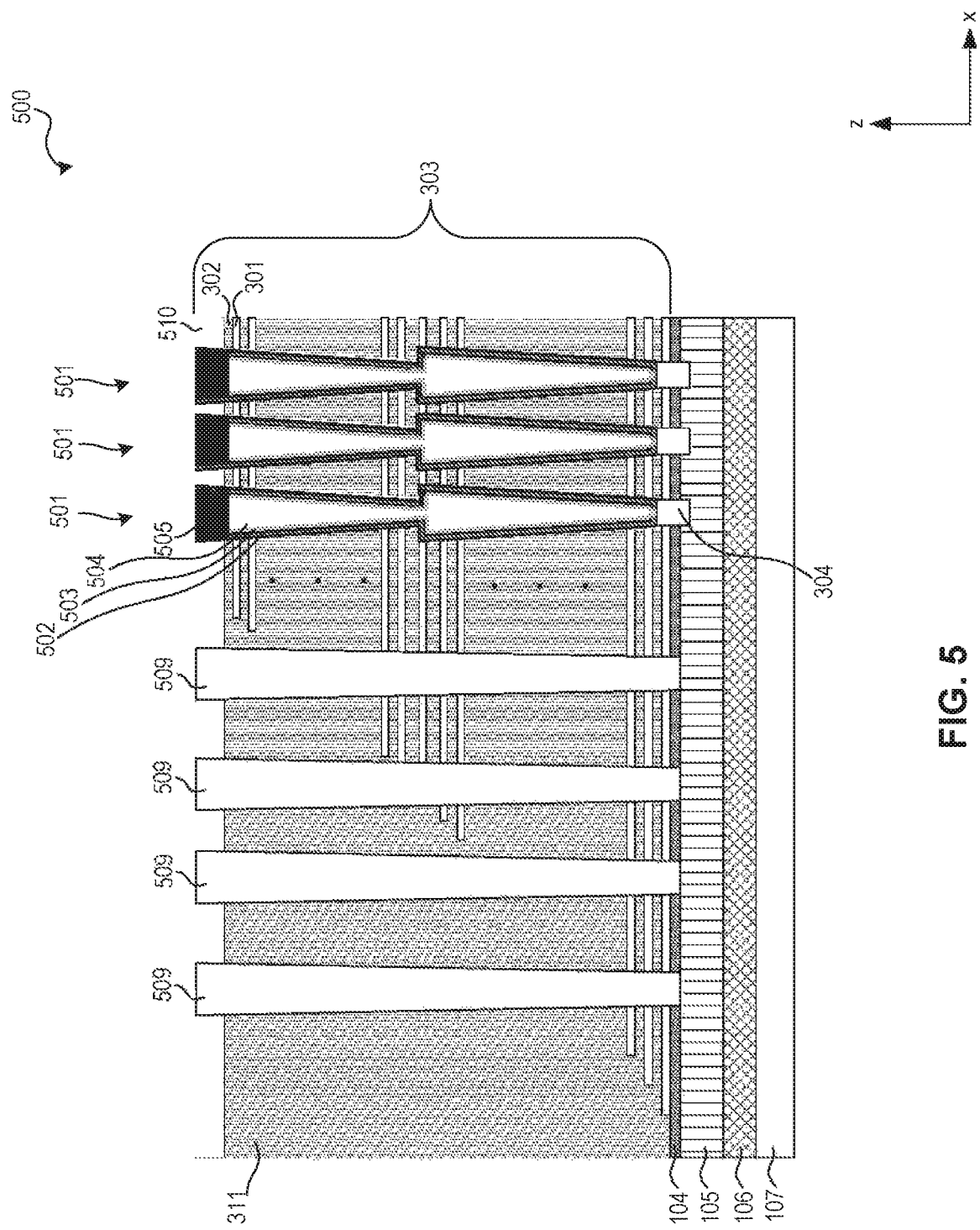

FIG. 5 illustrates an exemplary memory structure 500 formed based on memory structure 200, according to some embodiments. Different from memory structure 400, in memory structure 500, pillar holes 509 can be formed after the formation of staircase structure 303, semiconductor channels 501, and drain regions 505. Semiconductor channels 501, drain regions 505, and insulating cap layer 510 can respectively be the same as or similar to semiconductor channels 415, drain regions 419, and insulating cap layer 410 of FIG. 4. Charge trapping film 502, semiconductor channel film 503, and dielectric core 504 can be respectively the same as or similar to charge trapping film 416, semiconductor channel film 417, and dielectric core 418 of FIG. 4.

In an example, after the formation of dielectric filling structure 311 and the insulating cap material layer, second sub-channel holes can be formed in staircase structure 303. The second sub-channel holes can be the same as or similar to the second-channel holes depicted in FIG. 4. The second sub-channel holes can be formed by any suitable process. For example, a photoresist layer can be formed to cover at least a top surface of staircase structure 303. The photoresist layer can be patterned to form openings that expose portions of the insulating cap material layer. The locations of the openings can correspond to the locations of the second sub-channel holes. The patterned photoresist layer can then be used as an etch mask to remove portions of exposed insulating cap material layer and staircase structure 303 to form second sub-channel holes each extending from the top surface of the insulating cap layer 510 to the respective first sub-channel hole. Channel holes that extend from the top surface of the staircase structure 303 into substrate 107 can be formed. The patterned photoresist layer can be removed after the formation of the second sub-channel holes.

Channel-forming layers (similar to or the same as the channel-forming layers depicted in FIG. 4) can be formed to fill in the channel holes and form semiconductor channels 501. Further, top portions of semiconductor channels 501 can be removed and filled with a doped semiconductor material (e.g., doped polysilicon) to form drain regions 505. Drain regions 505 can have a thickness that is substantially the same as the insulating cap layer 510. A patterned photoresist layer with openings that define the locations of the pillar holes 509 can then be formed over the insulating cap layer 510. In some embodiments, the openings expose portions dielectric filing structure 311. A suitable etching process (e.g., dry etch and/or wet etch) can be performed (e.g., using the patterned photoresist layer) to remove portions of staircase structure 303 and dielectric filling structure 311 so that pillar holes 509 can be formed through insulating cap layer 510, staircase structure 303, and dielectric filling structure 311.

Any suitable pillar-filling materials (e.g., insulating materials such as silicon oxide and/or silicon nitride) can be deposited to fill in pillar holes 509 and form supporting pillars. In some embodiments, the pillar-filling materials can include pure dielectric materials such as pure silicon oxide and/or pure silicon nitride. In some embodiments, suitable dopants/impurities can be doped into the silicon oxide and/or silicon nitride to enhance support. In some embodiments, the pillar-filling material includes an insulating liner/spacer layer is formed over the sidewalls of pillar holes 509 and another support material that fills up the rest of pillar holes 509. In some embodiments, the insulating liner/spacer layer surrounds the support material. Any suitable material with sufficient stiffness and/or support functions can be used as the support material. For example, the support material can include one or more of copper, cobalt, nickel, and aluminum.

Figure 6:
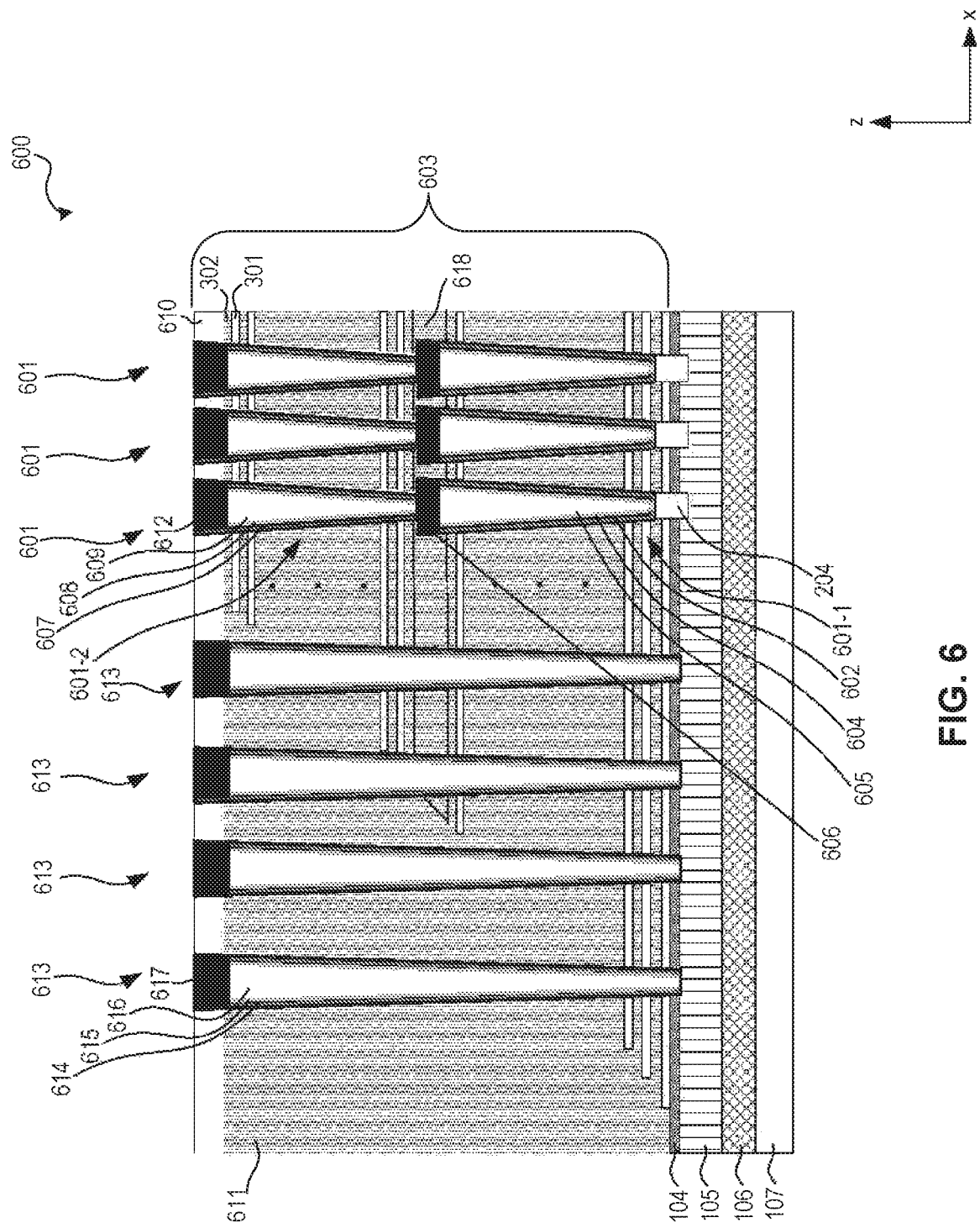

FIG. 6 illustrates another memory structure 600 formed based on memory structure 200, according to some embodiments. Different from memory structures 400 and 500, memory structure 600 (e.g., multiple-channel structure) can include semiconductor channels each including more than one semiconductor sub-channels stacked along the z axis. Multiple-channel structure can further increase memory cell density of the 3D memory device. In some embodiments, as shown in FIG. 6, semiconductor channel 601 extends through staircase structure 603 and includes semiconductor sub-channel 601-1 (e.g., formed in the lower staircase structure) and 601-2 (e.g., formed in the upper staircase structure). Semiconductor sub-channels 601-1 and 601-2 can be connected by a connection layer 606. In some embodiments, semiconductor sub-channels (e.g., 601-1 and 601-2) have same or similar functions as semiconductor channels 415 and 501 of FIGS. 4 and 5.

In an example, supporting pillars 613 can be formed by similar fabrication operations as in FIGS. 1-5. That is, pillar holes can be formed before or after the formation of sub-channel holes that form semiconductor sub-channels 601-2. The filing of the pillar holes can be performed at the same time with or after the filling of sub-channel holes of semiconductor sub-channels 601-2.

In contrast to the fabrication operations illustrated in FIGS. 1-4, to form memory structure 600, before the deposition of second dielectric stack (e.g., upper dielectric stack), semiconductor sub-channels 601-1 can be formed in the first dielectric stack (e.g., lower dielectric stack) before the deposition of second dielectric stack (e.g., upper dielectric stack). In the description of FIG. 6, the first dielectric stack and the second dielectric stack (e.g., the same as or similar to first dielectric stack 103 and second dielectric stack 206) can each include a plurality of alternatingly arranged sacrificial material layers and insulating material layers. In some embodiments, semiconductor sub-channels 601-2 are formed by, e.g., forming first sub-channel holes of semiconductor sub-channels 601-2 in first dielectric stack, respectively depositing charge trapping film 602, semiconductor channel film 604, and dielectric core 605 in the first sub-channel holes. The formation of the first sub-channel holes and the deposition of the films in the first sub-channel holes can be referred to the operations that form first sub-channel holes 205 and charge trapping film 502, semiconductor channel film 503, and dielectric core 504, respectively. Optionally, a recess etch (e.g., dry etch and/or wet etch) and/or a planarization process (e.g., CMP) can be performed to remove excessive dielectric material over the top surface of first dielectric stack.

Memory structure 600 can include a joint insulating layer 618 between semiconductor sub-channels 601-1 and 601-2 and a plurality of connection layers 606 in joint insulating layer 618. Connection layers 606 can function as drain regions and can connect semiconductor sub-channels 601-1 and 601-2. Joint insulating layer 618 can insulate connection layers 606 from one another. can be formed over the first dielectric stack before the formation of the first sub-channel holes. In some embodiments, joint insulating layer 618 includes silicon oxide and connection layers 606 include doped silicon. The formation of joint insulating layer 618 and connection layers 606 can be referred to the formation of insulating cap layer 410 and drain regions 419. The deposition can include any suitable deposition methods, such as CVD and/or area selective deposition (ASD). Optionally, an ion implantation process is employed to adjust the doping level of the recess region. The conductivity type of connection layer 606 can be the same as the conductivity type of semiconductor sub-channels 601-1. Optionally, a recess etch (e.g., dry etch and/or wet etch) and/or a planarization process (e.g., CMP) can be performed to remove excessive doped semiconductor material over the top surface of first dielectric stack. Optionally, an additional dielectric material can be deposited over the top surface of second dielectric stack to cover semiconductor sub-channels 601-1. The additional dielectric material can include one or more of the dielectric materials that form first dielectric stack 103.

Further, the second dielectric stack can be formed over the first dielectric stack, and staircase structure 603 can be formed by repeatedly etching/patterning the dielectric stack formed by the first dielectric stack and the second dielectric stack. A dielectric filling material can be deposited over staircase structure 603 to filling the space formed by the removal of portions of dielectric pairs and dielectric filling structure 611 (e.g., similar to dielectric filling structure 311) can be formed.

Semiconductor sub-channels 601-2 can be formed by any suitable methods after staircase structure 603 is formed. In some embodiments, second sub-channel holes of semiconductor sub-channels 601-2 are formed over semiconductor sub-channels 601-1. The bottom of the second sub-channel hole of semiconductor sub-channel 601-2 can expose connection layers 606. Further, a sequence of layers can be deposited into the second sub-channel holes to form second semiconductor sub-channels 601-2. The formation of the second sub-channel holes of semiconductor sub-channels 601-2, charge trapping film 607, semiconductor channel film 608, dielectric core 609, drain regions 612, and insulating cap layer 610 can be similar to the second sub-channel holes of semiconductor channels 415, charge trapping film 416, semiconductor channel film 417, dielectric core 418, drain regions 419, and insulating cap layer 410.

Supporting pillars 613 can be formed by the same fabrication operations that form semiconductor sub-channels 601-2 or after the formation of semiconductor sub-channels 601-2. The formation of dummy charge trapping film 614, dummy semiconductor channel film 615, dummy dielectric core 616, and dummy drain region 617 can be similar to or the same as the formation of dummy charge trapping film 411, dummy semiconductor channel film 412, dummy dielectric core 413, and dummy drain region 414.

FIGS. 7-12 illustrate an exemplary process to form a two-stack staircase structure from two dielectric stacks employing one staircase-forming patterning process, according to some embodiments. For viewing simplicity, FIGS. 7-12 depict the fabrication process to form the staircase structure in the core region shown in FIGS. 1-6. Same or similar operations performed in the method illustrated by FIGS. 7-12 can be referred to the operations described in FIGS. 1-6. For illustrative purposes, the formation of a double-channel structure (e.g., similar to memory structure 600 of FIG. 6) is described.

Figure 7:
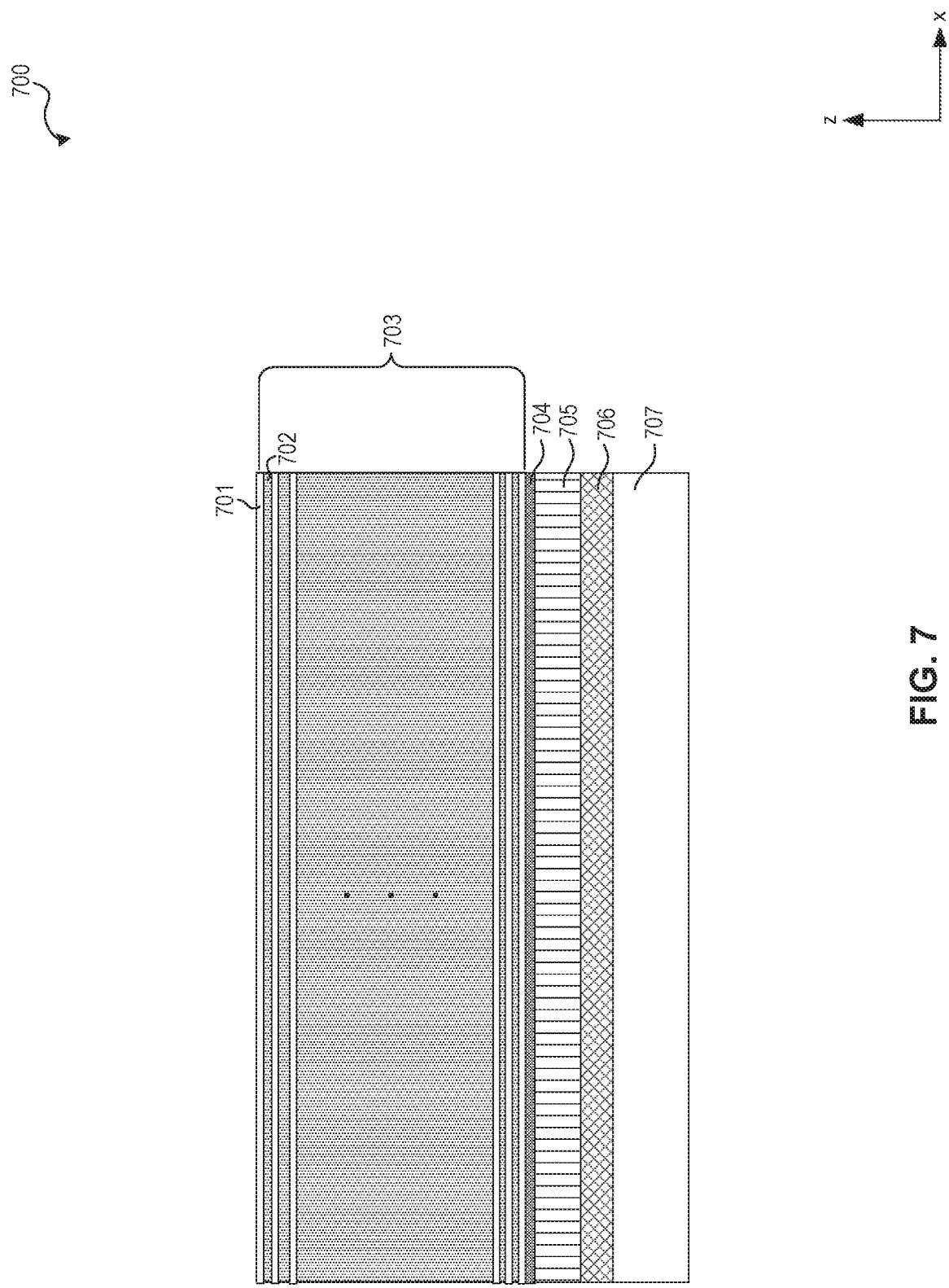

FIG. 7 illustrates memory structure 700 similar to core region 110 of FIG. 1, according to some embodiments. Memory structure 700 can include a first dielectric stack 703 over gate dielectric layer 704, which is further over substrate 707. Substrate 707 can include a first doped region 706, and a second doped region 705. First dielectric stack 703 can include a plurality of dielectric pairs, each including a sacrificial material layer 701 and an insulating material layer 702. Respectively, substrate 707, first doped region 706, second doped region 705, gate dielectric layer 704, and first dielectric stack 703 can be the same as or similar to substrate 107, first doped region 106, second doped region 105, dielectric layer 104, and first dielectric stack 103. Description of structure and formation methods of memory structure 700 can be referred to the description of memory structure 100.

Figure 8:
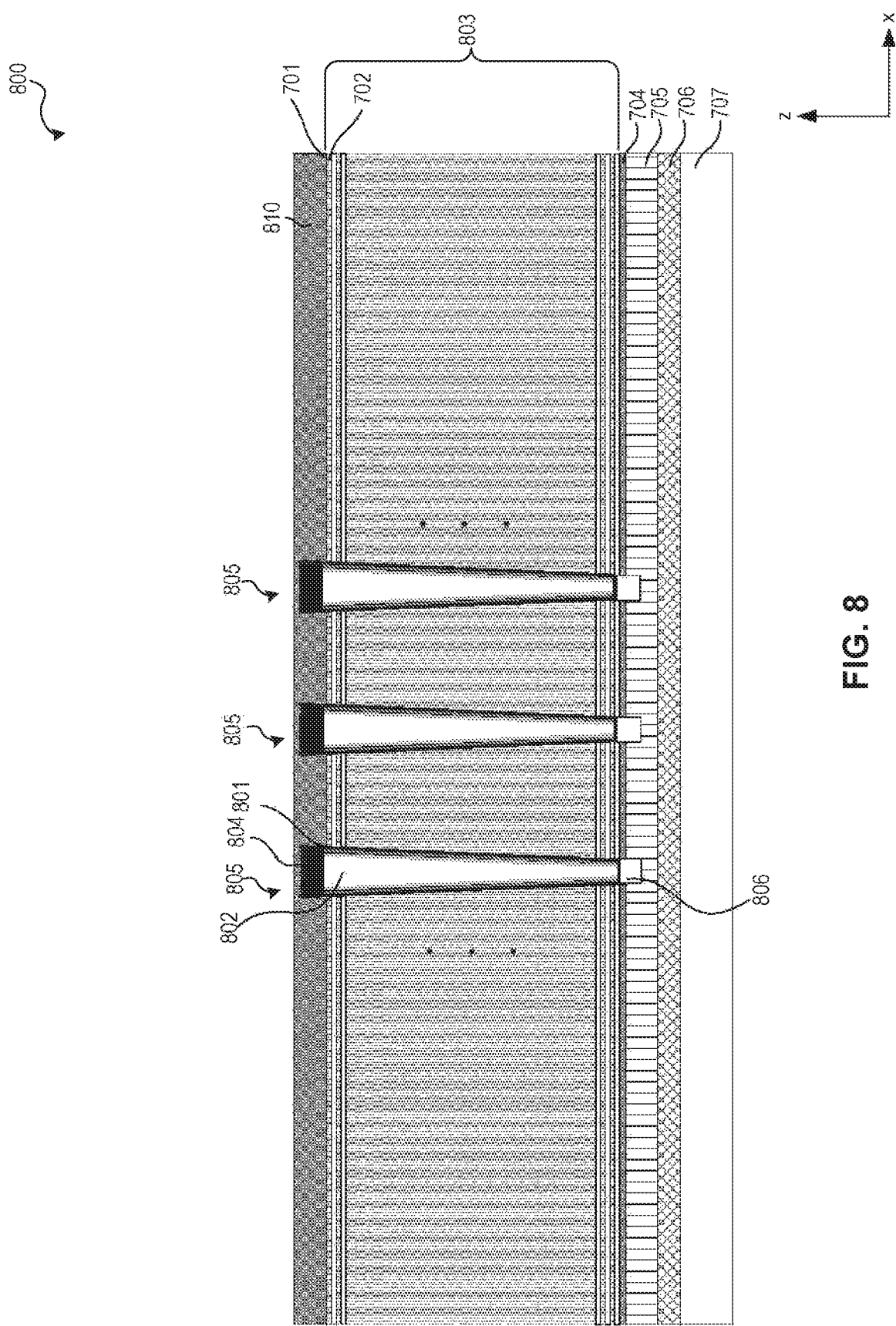

FIG. 8 illustrates memory structure 800 formed based on memory structure 700, according to some embodiments. Memory structure 800 can be formed from memory structure 700 by forming a plurality of channel epitaxial regions 806 extending from first dielectric stack 703 to second doped region 705, a joint insulating material layer 810 over first dielectric stack 703, a plurality of first sub-channel holes 801 extending from the top surface of joint insulating material layer 810 into channel epitaxial regions 806, and filling first sub-channel holes 801 with a series of channel-forming layers 802 (charge trapping film, semiconductor channel film, and dielectric core) to form semiconductor sub-channels 805. A plurality of connection layers 804 can be formed in joint insulating material layer 810 and can each be over a semiconductor sub-channel 805. In some embodiments, a recess etch and/or a suitable planarization process (CMP) can be performed to remove any excessive material of channel-forming layers 802 from the top surface of memory structure 800.

As an example, a joint insulating material layer can first be formed over first dielectric stack 703. A plurality of first sub-channel holes 801 can then be formed in first dielectric stack 703 to extend from the top surface of the joint insulating material into channel epitaxial regions 806. Joint insulating material layer 810 can be formed from the joint insulating material layer and first dielectric stack 803 can be formed from first dielectric stack 703. A series of channel-forming layers 802 can then be deposited to fill in first sub-channel holes 801. A suitable recess etch (e.g., dry etch and/or wet etch) can be performed to remove a top portion of channel-forming layers 802 in each first sub-channel hole 801 and a doped semiconductor material can be deposited into first sub-channel holes 801 to form connection layers 804 in joint insulating material layer 810. Optionally, additional insulating material can be deposited over connection layers 804 to insulate connection layers 804 from neighboring structures that are formed in subsequent operations. Details of the formation of semiconductor sub-channels 805 and connection layers 804 can be referred to the description of semiconductor channels 501 and drain regions 505.

Figure 9:
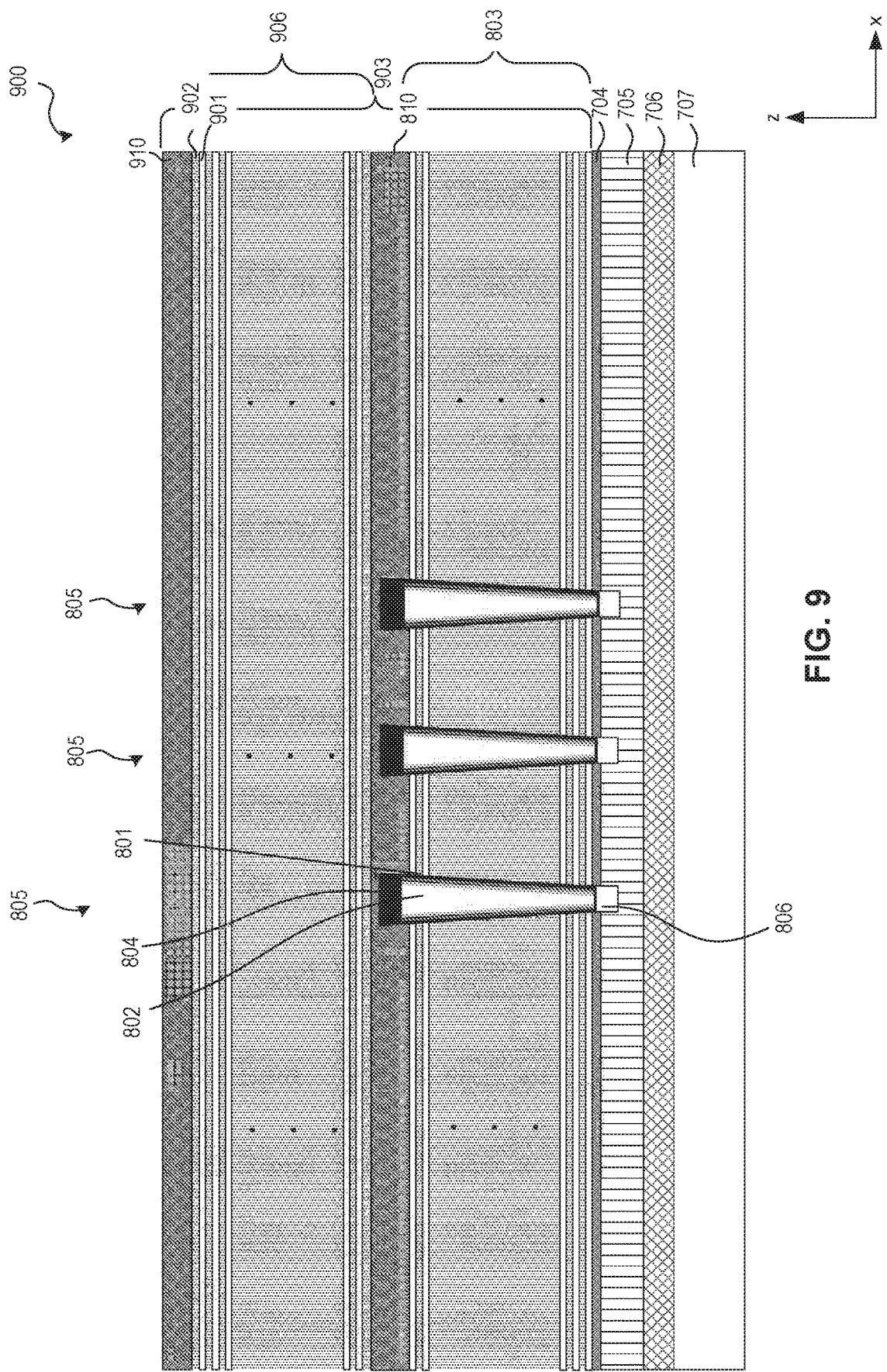

FIG. 9 illustrates an exemplary memory structure 900 formed based on memory structure 800, according to some embodiments. Memory structure 900 can be formed by forming second dielectric stack 906 over first dielectric stack 803. Similar to first dielectric stack 703 and 103, second dielectric stack 906 can include a plurality of dielectric pairs arranged over first dielectric stack 703 (e.g., joint insulating layer 810) along the z axis. Each dielectric pair can include a sacrificial material layer 901 and an insulating material layer 902. First dielectric stack 803 and second dielectric stack 906 can form dielectric stack 903 (e.g., two-stack dielectric stack). In some embodiments, an insulating cap material layer 910 (e.g., similar to the joint insulating material layer of FIG. 8 and the insulating cap material layer of FIG. 3) is formed over second dielectric stack 906. In some embodiments, second dielectric stack 906 is similar to first dielectric stack 703. Description of structure and formation methods of second dielectric stack 906 and insulating cap material layer 910 can be referred to the description of first dielectric stack 103 and the insulating cap material layer of FIG. 3.

Figure 10:
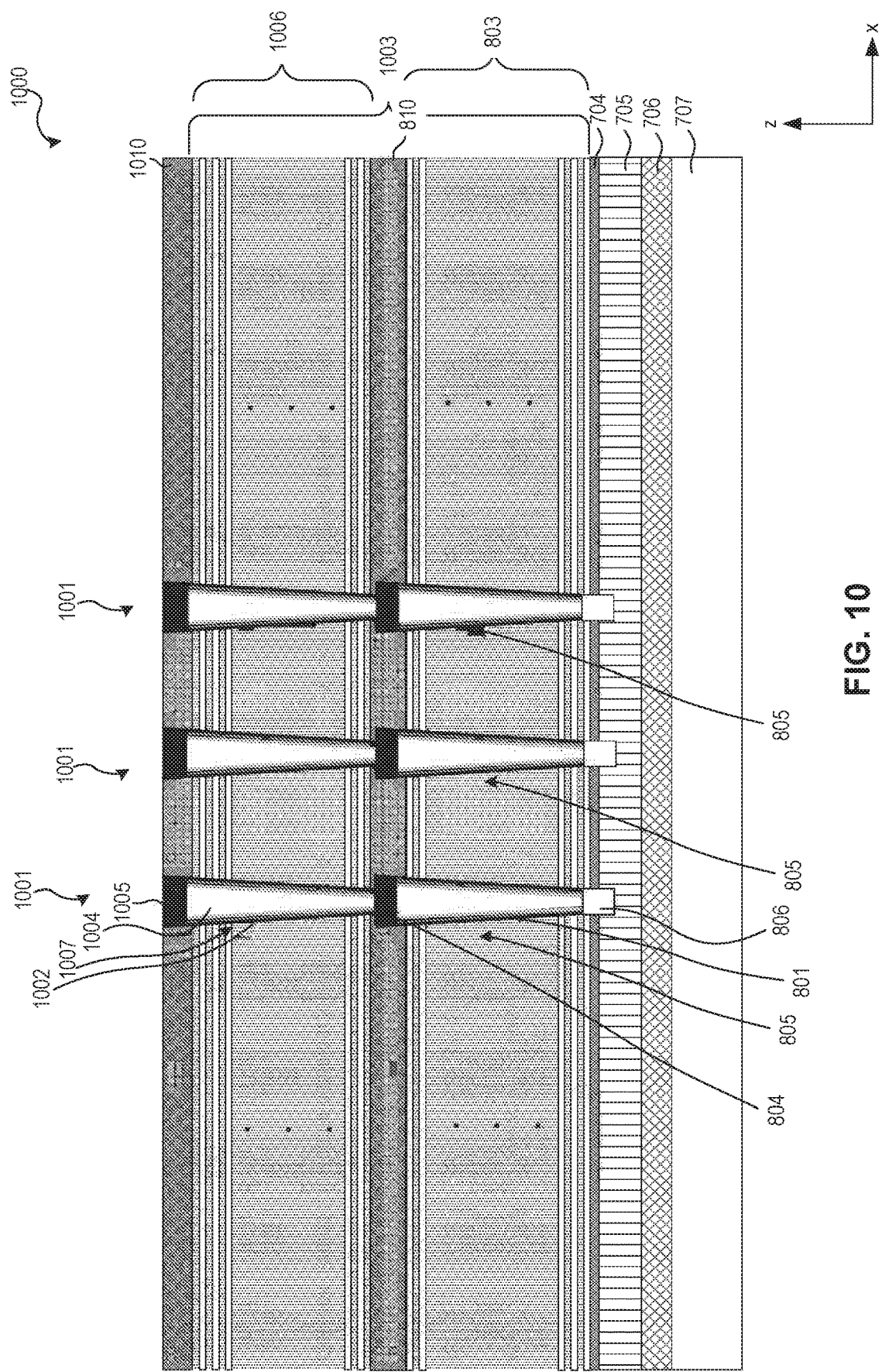

FIG. 10 illustrates an exemplary memory structure 1000 formed based on memory structure 900, according to some embodiments. Memory structure 1000 can be formed by forming a plurality of second semiconductor sub-channels 1007 that alight with and adjoin semiconductor sub-channels 805 to form semiconductor channels 1001 through dielectric stack 1003, and a plurality of drain regions 1005 in insulating cap material layer 1010. Dielectric stack 1003 can be formed from dielectric stack 903 after the formation of second semiconductor sub-channels 1007, and insulating cap material layer 1010 can be formed from insulating cap material layer 910 after the formation of second sub-channel holes 1002. In some embodiments, second semiconductor sub-channels 1007 are formed by depositing a series of channel-forming layers 1004 (charge trapping film, semiconductor channel film, and dielectric core) into second sub-channel holes 1002. In some embodiments, drain regions 1005 are formed by forming a recess region in insulating cap material layer 1010 and at the top portions of second sub-channel holes 1002, and depositing a doped semiconductor material (e.g., doped polysilicon) in the recess region. The fabrication processes of second semiconductor sub-channels 1007, drain regions 1005, and insulating cap material layer 1010 can be referred to the fabrication processes of semiconductor sub-channels 805, joint insulating material layer 810, and connection layers 804.

Figure 11:
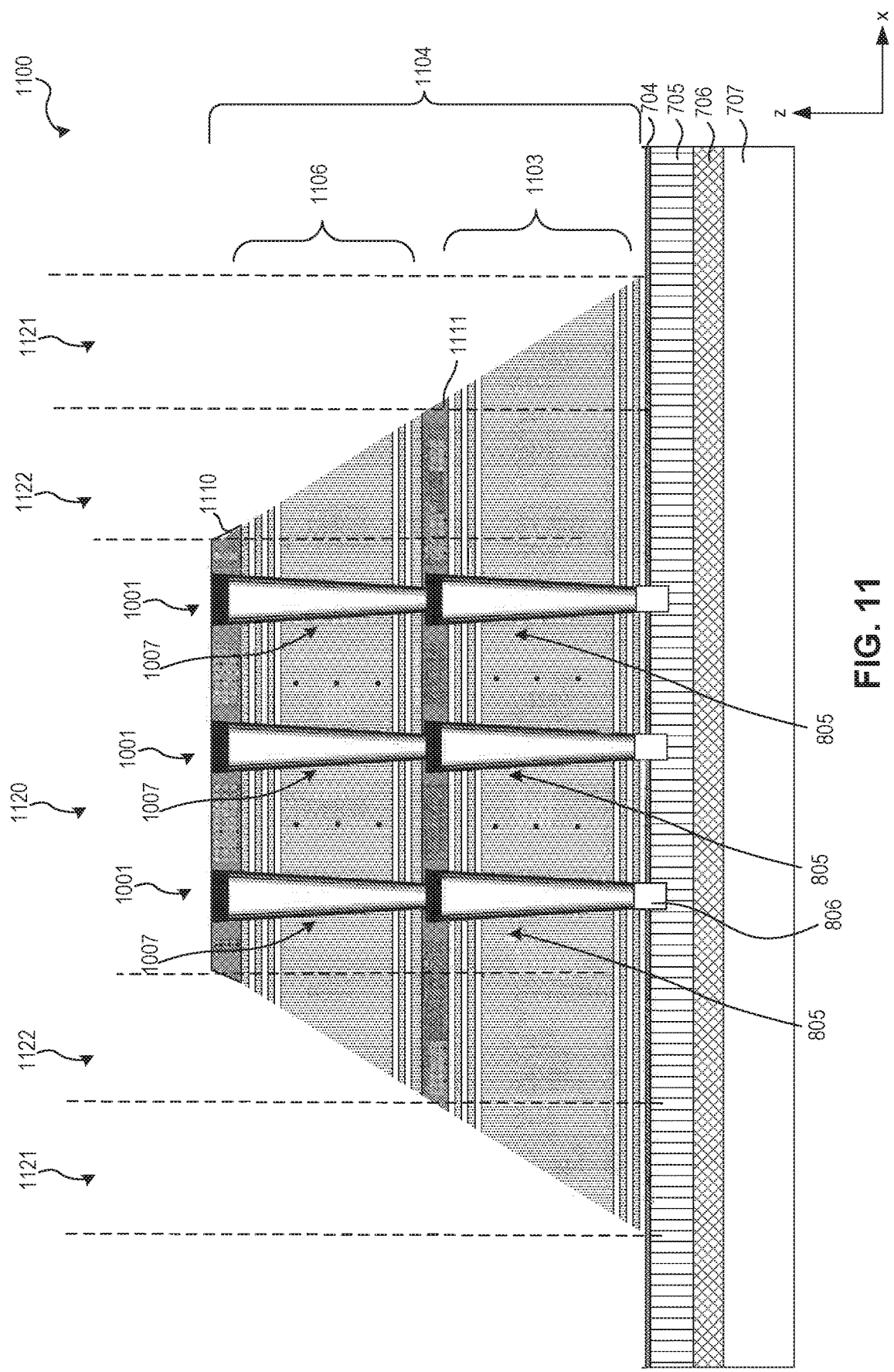

FIG. 11 illustrates memory structure 1100 formed based on memory structure 1000, according to some embodiments. Memory structure 1100 can be formed by performing a staircase-forming patterning process on dielectric stack 1003 to form staircase structure 1104. By performing the staircase-forming patterning process, first dielectric stack 803 can be etched to form first staircase structure 1103, and second dielectric stack 1006 can be etched to form second staircase structure 1106. First staircase structure 1103 and second staircase structure 1106 can stack along the z axis to form staircase structure 1104. In some embodiments, joint insulating material layer 810 and insulating cap material layer 1010 can be etched to form joint insulating layer 1111 and insulating cap layer 1110, respectively. The staircase-forming patterning process can include forming a photoresist layer over dielectric stack 1003. In some embodiments, the photoresist layer can be patterned (e.g., using a photolithography process) to cover the core region. The photoresist layer can have a sufficient thickness along the z axis so that it can be trimmed and used as an etching mask for forming staircases from dielectric stack 1003. During the staircase-forming patterning process, the photoresist layer is repeatedly trimmed (e.g., etched by a suitable dry etch and/wet etch) along various directions (e.g., the x axis, the y axis, and the z axis) so dielectric pairs of dielectric stack 1003 can be repeatedly exposed. Same or different etchant (e.g., wet etchant and/or dry etchant) can be used to etch the sacrificial material layer (e.g., 701 or 901) and the insulating material layer (e.g., 702 or 902). In some embodiments, the trimming time of the photoresist layer is controlled so that the trimming/etching rate of the photoresist layer can be controlled. Accordingly, the dimension of the staircase along the x direction can be controlled. In some embodiments, the sacrificial material layers can be etched to form the sacrificial layers, and the insulating material layers can be etched to form the insulating layers. One sacrificial layer can be pairing with one insulating layer. Depending on different memory device structures, the sacrificial layer can be on top of the pairing insulating layer, or vice versa.

For illustrative purposes, as shown in FIG. 11, memory structure 1100 is divided into core array region 1120, first staircase region 1121, and second staircase region 1122. First staircase region 1121 and second staircase region 1122 can each surround memory structure 1100 along the x-y plane. First staircase region 1121 can represent the region where staircases of first dielectric stack 703 are formed, and second staircase region 1122 can represent the region where staircases of second dielectric stack 906 are formed. In some embodiments, the photoresist layer (e.g., etch mask) can be trimmed to expose dielectric stack 1003 along, e.g., the x direction—from first staircase region 1121 towards core array region 1120, and staircases of staircase structure 1104 can be formed along the same direction the photoresist layer is trimmed. In some embodiments, staircases of first staircase structure 1103 (e.g., lower/bottom staircase structure) are formed in first staircase region 1121, and staircases of second staircase structure 1106 (e.g., upper/top staircase structure) are formed in second staircase region 1122. In some embodiments, the trimming of the photoresist layer can stop when the staircases in first staircase region 1121 and second staircase region 1122 are formed. The trimmed photoresist layer can cover the top surface of core array region 1120 so that semiconductor channels 1001 can remain intact. Photoresist layer can then be removed, and memory structure 1100 can be formed.

In various embodiments, semiconductor channels 1001 can be formed before or after the formation of staircase structure 1104. That is, the second semiconductor sub-channels (e.g., formed in second dielectric stack 1006) can also be formed after staircase structure 1104 is formed. The different orders to form semiconductor channels 1001 and staircase structure 1104 should still be within the scope of the present disclosure.

Figure 12:
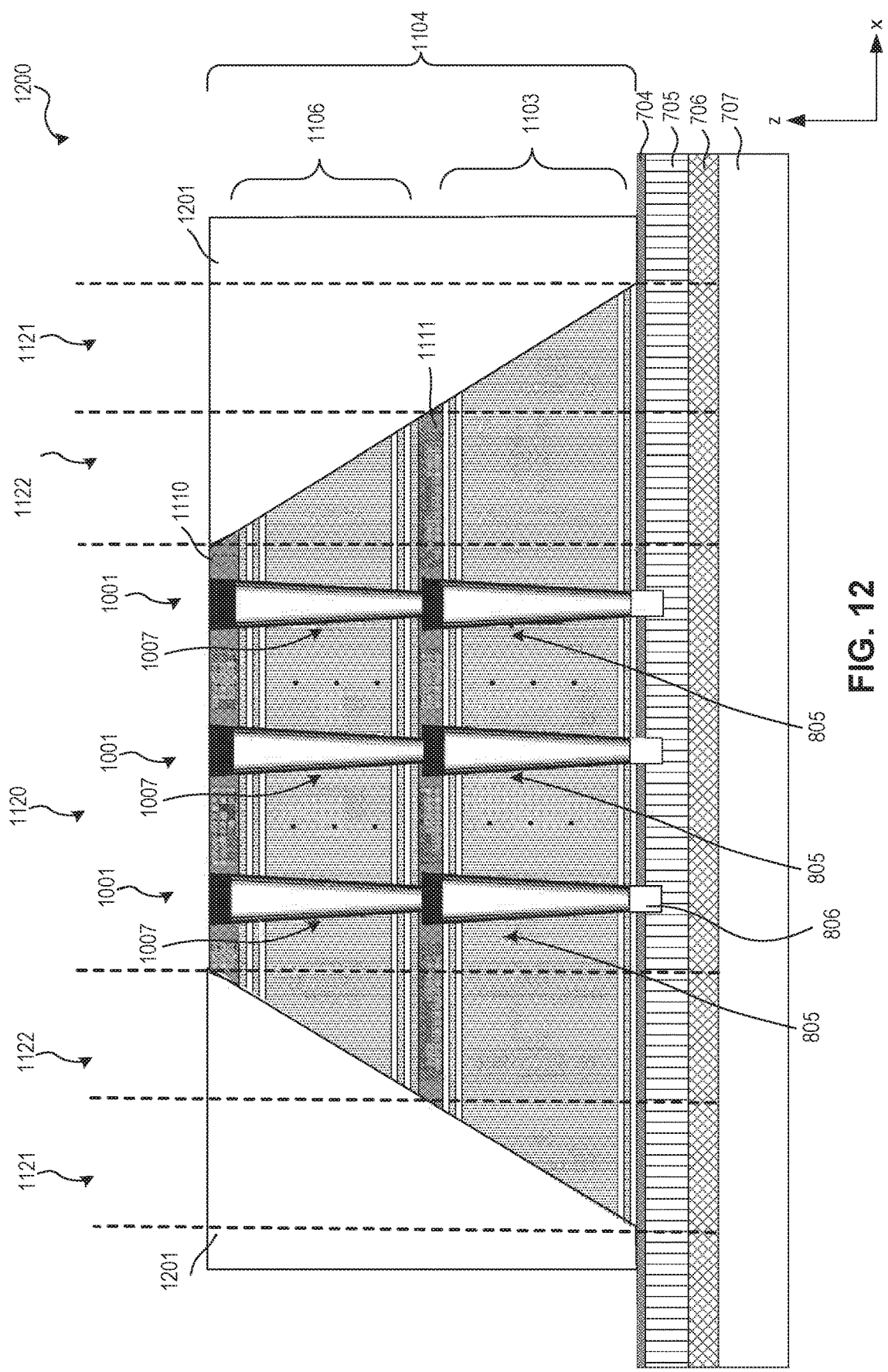

FIG. 12 illustrates memory structure 1200 formed based on memory structure 1100, according to some embodiments. Memory structure 1200 can be formed by forming dielectric filling structure 1201 to fill in the space formed by the removal of portions of dielectric stack 1003. Dielectric filling structure 1201 can be retro-stepped (not shown in FIG. 12). In some embodiments, dielectric filling structure 1201 is formed by depositing a suitable dielectric filling structure to fill in the space and performing a suitable planarization process (e.g., CMP and/or recess etch) to remove any excessive dielectric filling structure over the top surface of memory structure. In some embodiments, dielectric filling structure 1201 is similar to or as same as dielectric filling structure 311. Description of structure and formation methods of dielectric filling structure 1201 can be referred to the description of dielectric filling structure 311.

Further, the sacrificial layers can be removed by a suitable isotropic etching process, and space formed by the removal of the sacrificial layers can be filled with a suitable metal, e.g., one or more of copper, tungsten, and aluminum. Optionally, a recess etch can be performed to remove excessive metal over staircase structure 1104. The deposited metal can then form the word lines of the 3D memory device. In some embodiments, each word line is insulated from adjacent word lines by the insulating layers in between.

Method illustrated by FIGS. 7-12 can be employed to form the staircase structure in FIGS. 1-6 and semiconductor channels embedded in the staircase structure. By using the disclosed method, one staircase-forming pattern can be used to form the staircase structure that contains at least two sub-staircase structures stacked along the z axis. No staircase-forming pattern is needed to separately form the sub-staircase structures. The fabrication process of the 3D memory device can be simplified.

Further, supporting pillars through the multiple-stack staircase structure can be formed by one etching process that forms pillar holes through the multiple-stack staircase structure and subsequent filling process. In some embodiments, the pillar holes are formed at the same time or by same fabrication operations as a part of the semiconductor channels. In some embodiments, the pillar holes are formed after the formation of the semiconductor channels. Compared to existing technology, the number of operations to form supporting pillars is reduced. The fabrication of the 3D memory device is thus simpler and less costly.

Figure 13:
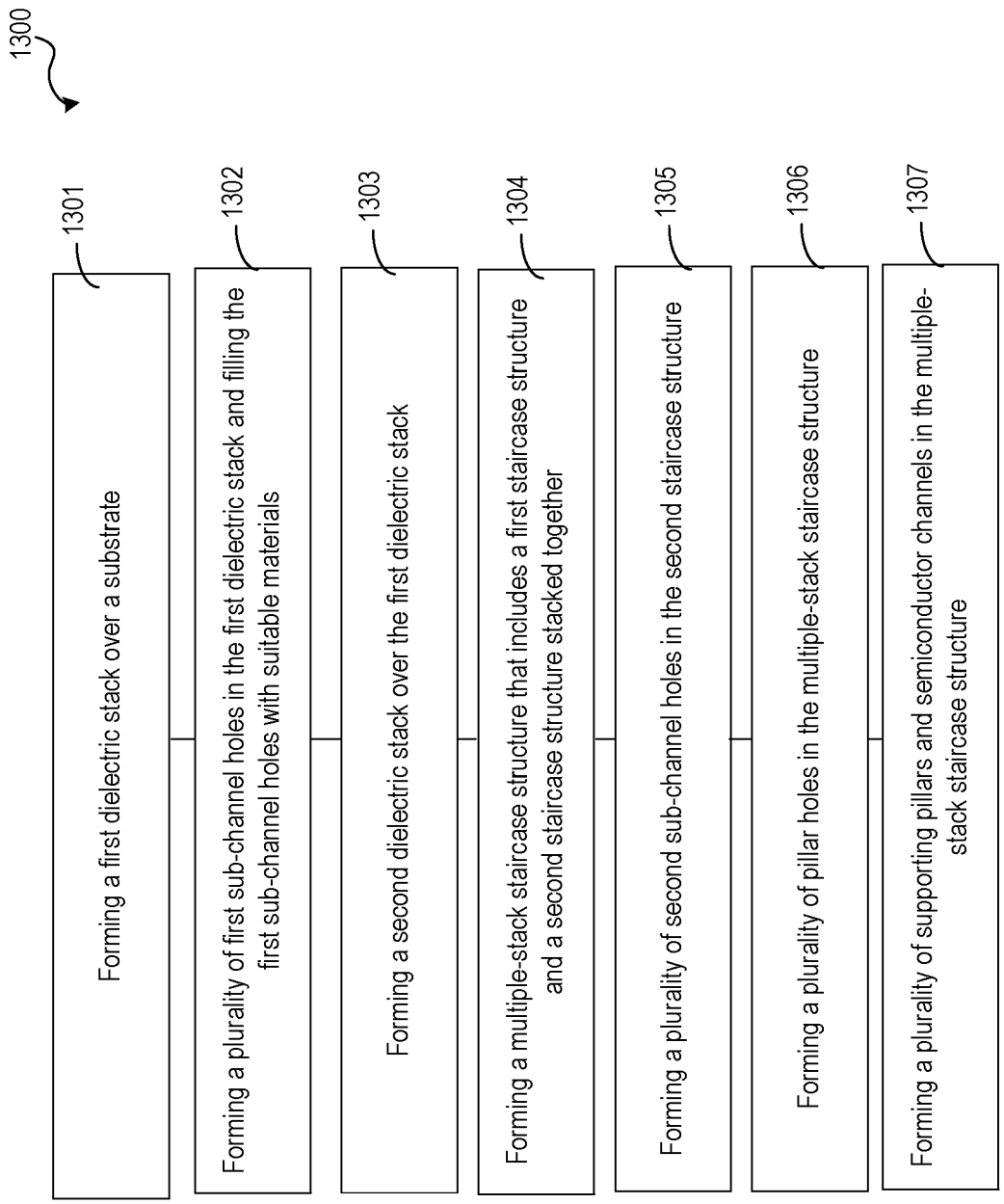
FIG. 13 is an exemplary fabrication process to form a 3D memory device, according to some embodiments.

FIG. 13 is an illustration of an exemplary method 1300 for forming three-dimensional memory structure, according to some embodiments. For explanation purposes, the operations shown in method 1300 are described in the context of FIGS. 1-12. In various embodiments of the present disclosure, the operations of method 1300 can be performed in a different order and/or vary.

At operation 1301, a first dielectric stack can be formed over a substrate. In some embodiments, the substrate can include any suitable materials such as silicon. In some embodiments, the first dielectric stack includes a plurality of alternatingly arranged sacrificial material layers and insulating materials. The sacrificial material layers and the insulating material layers can include different dielectric materials. In some embodiments, a gate dielectric layer is formed between the first dielectric stack and the substrate. Details of the first dielectric stack, the gate dielectric layer, and the substrate can be referred to the description of FIG. 1.

At operation 1302, a plurality of first sub-channel holes can be formed in the first dielectric stack and the first sub-channel holes can be filled with suitable materials. In some embodiments, the first sub-channel holes can be formed with suitable patterning and etching processes so that the bottoms of the first sub-channel holes contact or expose the substrate. The first sub-channel holes can be through the first dielectric stack. Optionally, a channel epitaxial region can be formed at the bottom of each first sub-channel hole. A sacrificial filling structure can be formed in the first sub-channel holes by depositing a sacrificial filling material, as e.g., place holders, to provide support for the formation of subsequent second dielectric stack over the first dielectric stack. A planarization process can be performed to remove any excessive sacrificial filling material over the first dielectric stack.

When the 3D memory device is a double-channel memory device, a series of channel-forming layers for forming a semiconductor channel can be sequentially deposited into the plurality of first sub-channel holes so that first semiconductor sub-channels can be formed. The series of layers can include a charge trapping film, a semiconductor channel film, and a dielectric core, being deposited from the sidewall to the center of the channel hole. A connection layer (e.g., a doped semiconductor layer) can be formed over each semiconductor sub-channel. Details of the first sub-channel holes, the sacrificial filling structure, the semiconductor sub-channels, and the channel epitaxial region can be referred to the description of FIGS. 2 and 6.

At operation 1303, a second dielectric stack can be formed over the first dielectric stack. Similar to the first dielectric stack, the second dielectric stack can include a plurality of alternatingly arranged sacrificial material layers and insulating materials. Details of the second dielectric stack can be referred to the description of FIG. 2.

At operation 1304, a multiple-stack staircase structure can be formed. The multiple-stack (e.g., two-stack) staircase structure can include a first staircase structure (e.g., formed based on the first dielectric stack) and a second staircase structure (e.g., formed based on the second dielectric stack). The multiple-stack staircase structure can be formed by a staircase-forming patterning process so that dielectric pairs of the first dielectric stack and the second dielectric stack can be etched to form staircases. A dielectric filling structure can be formed to fill up the space formed by the removal of portions of the dielectric pairs. Details of the process to form the multiple-stack staircase structure can be referred to the description of FIGS. 7-12.

At operation 1305, a plurality of second sub-channel holes can be formed in the second staircase structure. The second sub-channel holes can adjoin the first sub-channel holes along a direction perpendicular to the top surface of the substrate. In some embodiments, a second sub-channel hole and the adjoined first sub-channel hole form a channel hole through the multiple-stack staircase structure. When the 3D memory device is a double-channel memory device, the second sub-channel holes can also be referred to as sub-channel holes of the second staircase structure. The formation of second sub-channel holes can be similar to the formation of first sub-channel holes described in operation 1302.

At operation 1306, a plurality of pillar holes can be formed in the multiple-stack staircase structure. The pillar holes can be formed by any suitable patterning/etching process. In some embodiments, the pillar holes can be through the multiple-stack staircase structure and can contact the substrate. Details of the process to form the pillar holes can be referred to the description of FIGS. 3 and 5.

At operation 1307, a plurality of supporting pillars and semiconductor channels can be formed in the multiple-stack staircase structure. The semiconductor channels can be formed by removing the sacrificial filling structures in the first sub-channel holes and filling the first sub-channel holes and the adjoined second sub-channel holes with a series of layers (e.g., a charge trapping film, a semiconductor channel film, and a dielectric core). When the 3D memory device is a double-channel memory device, the series of layers can be deposited in the second sub-channel holes (e.g., sub-channel holes) to form semiconductor sub-channels in the second staircase structure.

The supporting pillars can be formed by filling the same series of layers of the semiconductor channels in the pillar holes. The filling of the supporting pillars can be performed at the same time and/or through the same fabrication processes when the semiconductor channels (or semiconductor sub-channels of the second/upper staircase structure) are being formed. The supporting pillars can also be formed using any other suitable pillar-forming material such as a dielectric material with or without other support materials (such like metal). In some embodiments, the dielectric material is deposited into a pillar hole to form an insulating liner/spacer layer over the sidewall of the pillar hole, and the metal material is deposited to fill up the pillar hole. The insulating liner/spacer layer can insulate the metal material from the rest of memory structure 1200, and the metal material can provide further support to the supporting pillar. In some embodiments, the dielectric material includes silicon oxide, and the metal material includes copper. The insulating liner/spacer layer can include a single layer or a multiple layer. In an example, the insulating liner/spacer layer can include a single layer of silicon oxide or multiple layers of silicon oxide/silicon oxynitride/silicon oxide. The silicon oxide can be pure or doped with suitable impurities such as tungsten, copper, cobalt, nickel, and/or aluminum. The dielectric material can be deposited using any suitable process such as ALD, CVD, and/or spin-on-coating. The metal material can be deposited by, e.g., sputtering, spin-on-coating, and/or CVD.

In various embodiments, the order of operations 1304-1306 can vary. For example, the second sub-channel holes can be formed before or after the formation of multiple-stack staircase structure, and the pillar holes can be formed before or after the formation of second sub-channel holes. In some embodiments, the pillar holes can be formed at the same time with the second sub-channel holes by a same etching/patterning process. The filling of pillar holes can also be at the same time as or a different time than the filling of the second sub-channel holes. The specific orders of operations can be dependent on different fabrication requirements and should not be limited by the embodiments of the present disclosure. Details of the formation of supporting pillars and semiconductor channels can be referred to the description of FIGS. 4-6.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a memory device, comprising:
    forming a plurality of dielectric stacks stacked on one another over a substrate to create a multiple-stack staircase structure, wherein each one of the plurality of dielectric stacks comprises a plurality of dielectric pairs arranged along a direction perpendicular to a top surface of the substrate;
    forming a filling structure over the multiple-stack staircase structure;
    forming a semiconductor channel extending through the multiple-stack staircase structure, wherein the semiconductor channel comprises unaligned sidewall surfaces; and
    forming a supporting pillar extending through at least one of the multiple-stack staircase structure and the filling structure, wherein the supporting pillar comprises aligned sidewall surfaces.

2. The method of claim 1, wherein forming the supporting pillar comprises:
    forming a pillar hole extending through the multiple-stack staircase structure into the substrate; and
    filling the pillar hole with a first material.

3. The method of claim 2, wherein forming the semiconductor channel comprises:
    forming a first sub-channel hole in a first dielectric stack of the plurality of dielectric stacks;
    filling the first sub-channel hole with a sacrificial filling material to form a sacrificial filling structure;
    forming a second dielectric stack over the first dielectric stack;
    forming a second sub-channel hole in the second dielectric stack;
    removing the sacrificial filling structure in the first sub-channel hole; and
    filling the first sub-channel hole and the second sub-channel hole with a second material.

4. The method of claim 3, wherein
    the second sub-channel hole is connected with the first sub-channel hole to form a channel hole comprising a connected surface at a connection portion, and an extending direction of the connected surface is crossed with an extending direction of a surface of the first sub-channel hole and a surface of the second sub-channel hole.

5. The method of claim 4, wherein:
    the first material is the same as the second material and both are formed by same fabrication operations; and
    the same fabrication operations comprise depositing at least one of a charge trapping film, a semiconductor channel film, and a dielectric core into the channel hole and the pillar hole.

6. The method of claim 3, wherein the pillar hole is formed before a formation of the second sub-channel hole.

7. The method of claim 3, wherein the pillar hole is formed after a formation of the first sub-channel hole and a formation of the second sub-channel hole.

8. The method of claim 4, wherein the first material is different from the second material and is formed by a different deposition operation than the second material.

9. The method of claim 8, wherein the first material comprises at least one of an insulating material and a pillar-support material surrounded by the insulating material; and the second material comprises at least one of a charge trapping film, a semiconductor channel film, and a dielectric core.

10. The method of claim 1, wherein forming the semiconductor channel comprises:
forming a first semiconductor sub-channel in a first dielectric stack;
forming a connection layer over the first semiconductor sub-channel, wherein the connection layer comprises a doped semiconductor material; and
forming a second dielectric stack and a second semiconductor sub-channel in a second dielectric stack, wherein the second semiconductor sub-channel is connected with the first semiconductor sub-channel to form a semiconductor channel extending through the plurality of dielectric stacks and into the substrate.

11. The method of claim 10, wherein:
the first material is the same as the second material and both are formed by same fabrication operations; and
the same fabrication operations comprise depositing at least one of a charge trapping film, a semiconductor channel film, and a dielectric core into a channel hole and a pillar hole.

12. The method of claim 2, wherein the first material comprises conductive material.

13. The method of claim 12, wherein the first material is composed of conductive material.

14. The method of claim 3, wherein the pillar hole is formed after the formation of the second dielectric stack.

15. The method of claim 3,
wherein the first sub-channel hole is formed before the formation of the second dielectric stack, and
wherein the second sub-channel hole is formed after the formation of the second dielectric stack.

16. The method of claim 2, wherein the multiple-stack staircase structure is formed after the formation of a second dielectric stack.

17. A method for forming a memory device, comprising:
forming a first dielectric stack of a plurality of dielectric stacks, wherein each one of the plurality of dielectric stacks comprises a plurality of first material layers and second material layers alternatingly arranged;
forming a first semiconductor sub-channel in the first dielectric stack of the plurality of dielectric stacks;
forming a second dielectric stack of the plurality of dielectric stacks over the first dielectric stack, wherein a multiple-dielectric-stack structure comprises the first dielectric stack and the second dielectric stack;
forming a second semiconductor sub-channel in the second dielectric stack of the plurality of dielectric stacks, wherein the second semiconductor sub-channel is connected with the first semiconductor sub-channel; and
patterning the multiple-dielectric-stack structure to form a multiple-stack staircase structure wherein the patterning the multiple-dielectric-stack structure comprises a single staircase-forming patterning process.

18. The method of claim 17, wherein the staircase-forming patterning process comprises:
forming a photoresist layer over the multiple-dielectric-stack structure;
trimming the photoresist layer along a first direction parallel to a top surface of a substrate; and
etching the multiple-dielectric-stack structure, using the trimmed photoresist layer as an etch mask to form a staircase.

19. The method of claim 18, wherein forming the first semiconductor sub-channel and the second semiconductor sub-channel comprise:
forming a first sub-channel hole in the first dielectric stack;
forming a second sub-channel hole in the second dielectric stack; and
filling each of the first sub-channel hole and the second sub-channel hole with channel-forming layers, wherein the channel-forming layers comprise at least one of a charge trapping film, a semiconductor channel film, and a dielectric core.

20. The method of claim 17, further comprising forming a pillar hole extending through the plurality of dielectric stacks after the formation of the second dielectric stack.

* * * * *